United States Patent
Au et al.

(10) Patent No.: US 7,523,232 B2
(45) Date of Patent: Apr. 21, 2009

(54) MARK/RE-READ AND MARK/RE-WRITE OPERATIONS IN A MULTI-QUEUE FIRST-IN FIRST-OUT MEMORY SYSTEM

(75) Inventors: Mario Au, Fremont, CA (US); Jason Z. Mo, Fremont, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 241 days.

(21) Appl. No.: 11/040,637

(22) Filed: Jan. 21, 2005

(65) Prior Publication Data

US 2006/0018176 A1 Jan. 26, 2006

Related U.S. Application Data

(60) Provisional application No. 60/591,499, filed on Jul. 26, 2004, provisional application No. 60/600,347, filed on Aug. 9, 2004.

(51) Int. Cl.
*G06F 3/00* (2006.01)
*G06F 5/00* (2006.01)
*G06F 13/00* (2006.01)
*G06F 7/38* (2006.01)
*G11C 7/00* (2006.01)
*H03K 19/173* (2006.01)

(52) U.S. Cl. .............. 710/52; 710/34; 710/54; 365/189.12; 365/221; 326/38

(58) Field of Classification Search ............ 365/189.12, 365/221; 326/38; 711/151; 710/52, 54, 710/34

See application file for complete search history.

(56) References Cited

U.S. PATENT DOCUMENTS 4,486,854 A  12/1984  Yuni ......................... 711/100
4,873,666 A * 10/1989  Lefebvre et al. ........ 365/189.07
4,888,739 A  12/1989  Frederick et al. ............. 365/221
5,079,693 A *  1/1992  Miller ......................... 711/156
5,084,891 A  1/1992  Ariyavisitakul et al. ...... 714/775
5,506,809 A  4/1996  Csoppenszkey et al. ...... 365/221
5,508,679 A  4/1996  McClure .................. 340/146.2
5,600,820 A  2/1997  Johnston (Continued)

FOREIGN PATENT DOCUMENTS

JP       2004139377 A * 5/2004

*Primary Examiner*—Henry W. H. Tsai
*Assistant Examiner*—Tushar S Shah
(74) *Attorney, Agent, or Firm*—Bever, Hoffman & Harms

(57) ABSTRACT

In a multi-queue memory system, a plurality of read count pointers (one for each queue) are stored in a read address file, and used to generate empty flags. A read count pointer associated with a first queue is retrieved from the read address file, and it is determined whether the first queue should be available for a re-read operation. If so, the retrieved read count pointer is stored as a first read mark value. The read count pointer is incremented in response to each read operation performed from the first queue, thereby creating an adjusted read count pointer. If a re-read operation is to be performed from the first queue, the first read mark value is stored in the read address file. Otherwise, the adjusted first read count pointer is stored in the read address file. Similar operations are performed on the write side of the multi-queue memory system.

16 Claims, 20 Drawing Sheets

U.S. PATENT DOCUMENTS

| | | | |
|---|---|---|---|
| 6,044,418 A | 3/2000 | Muller | 710/56 |
| 6,145,061 A | 11/2000 | Garcia et al. | 711/154 |
| 6,525,980 B1 | 2/2003 | Au et al. | 365/221 |
| 6,678,759 B2 | 1/2004 | Stockton et al. | 710/52 |
| 6,745,264 B1 | 6/2004 | Luke et al. | 710/52 |
| 6,757,679 B1 | 6/2004 | Fritz | 707/8 |
| 6,795,360 B2 * | 9/2004 | Au et al. | 365/221 |
| 6,947,437 B1 | 9/2005 | Erimli et al. | |
| 7,093,037 B2 | 8/2006 | Duckman | 710/52 |
| 2002/0080672 A1 * | 6/2002 | Lee et al. | 365/221 |
| 2003/0018862 A1 * | 1/2003 | Karnstedt et al. | 711/156 |
| 2003/0034797 A1 * | 2/2003 | Bentz | 326/38 |
| 2003/0120842 A1 | 6/2003 | Bace | 710/57 |
| 2006/0017497 A1 | 1/2006 | Mo et al. | 327/34 |
| 2006/0020743 A1 | 1/2006 | Au et al. | 365/230.04 |

\* cited by examiner

MARK/RE-READ AND MARK/RE-WRITE OPERATIONS IN A MULTI-QUEUE FIRST-IN FIRST-OUT MEMORY SYSTEM

RELATED APPLICATIONS

The present application is related to, and incorporates by reference, U.S. Provisional Patent Application Ser. No. 60/591,499 filed by Mario Au, Jason Z. Mo, Xiaoping Fang, Hui Su, Cheng-Han Wu, Ta-Chung Ma and Lan Lin on Jul. 26, 2004. The present application is also related to, and incorporates by reference, U.S. Provisional Patent Application Ser. No. 60/600,347 filed by Mario Au, Jason Z. Mo, Xiaoping Fang, Hui Su, Cheng-Han Wu, Ta-Chung Ma and Lan Lin on Aug. 9, 2004.

The present application is also related to, and incorporates by reference, the following commonly owned, co-filed U.S. patent applications.

U.S. patent application Ser. No. 11/040,892 entitled "Multiple Counters to Relieve Flag Restriction in a Multi-Queue First-In First-Out Memory System" by Mario Au and Jason Z. Mo.

U.S. patent application Ser. No. 11/040,895 entitled "Interleaving Memory Blocks to Relieve Timing Bottleneck in a Multi-Queue First-In First-Out Memory System" by Mario Au, Jason Z. Mo, Ta-Chung Ma and Lan Lin.

U.S. patent application Ser. No. 11/040,896 entitled "Partial Packet Read/Write and Data Filtering in a Multi-Queue First-In First-Out Memory System" by Mario Au, Jason Z. Mo and Hui Su.

U.S. patent application Ser. No. 11/040,804, now U.S. Patent No. 7,257,687 entitled "Synchronization of Active Flag and Status Bus Flags in a Multi-Queue First-In First-Out Memory System" by Mario Au, Jason Z. Mo and Cheng-I-Tan Wu.

U.S. patent application Ser. No. 11/040,893 entitled "Status Bus Accessing Only Available Quadrants During Loop Mode Operation in a Multi-Queue First-In First-Out Memory System" by Mario Au, Jason Z. Mo and Cheng-Han Wu.

U.S. patent application Ser. No. 11/040,926 entitled "Multi-Queue Address Generator for Start and End Addresses in a Multi-Queue First-In First-Out Memory System" by Maria Au, Jason Z. Mo and Xiaoping Fang.

U.S. patent application Ser. No. 11/040,927, now U.S. Pat. No. 7,154,327 entitled "Self-Timed Multiple Blanking For Noise Suppressiong During Flag Generation in a Multi-Queue First-In First-Out Memory System" by Mario Au and Jason Z. Mo.

FIELD OF THE INVENTION

The present invention relates to a multi-queue first in, first out (FIFO) memory.

PRIOR ART

In a conventional multi-queue FIFO memory, a queue switch may be performed, wherein during a read (or write) operation, processing switches from one queue (a present queue) to another queue (a new queue).

FIG. 1 is a waveform diagram illustrating a typical queue switch performed during a read operation. Read operations in the conventional multi-queue FIFO memory are performed to provide output data (DOUT) in response to a read clock signal (RCLK), a read enable signal (REN#), a read address enable signal (RADEN), a read counter value (RCNT), a write counter value (WCNT), a programmable almost empty flag (PAE#) and an empty flag (EF).

In FIG. 1, the read enable signal REN# is activated low, thereby indicating that read operations should be performed. The read clock signal RCLK exhibits queue switch cycles QS-1, QS0, QS1, QS2 and QS3, which are labeled with respect to the time that the read address enable signal RADEN is activated. The read address enable signal RADEN is activated prior to the beginning of cycle QS-1, thereby indicating that a queue switch should be performed. That is, data should no longer be read from a present queue (PQ), but rather from a new queue (NQ) identified by a new read address (not shown). In the described example, there is a four-cycle latency during a queue switch, such that data (NQ1, NQ2) is not read from the new queue until cycle QS3.

After the read address enable signal RADEN is activated, data values PQ1, PQ2, PQ3 and PQ4 are read from the present queue during the next four cycles QS-1, QS0, QS1, and QS2, respectively. During the cycles QS-1, QS0 and QS1, the read counter value ($RCNT_P$) and write counter value ($WCNT_P$) associated with the present queue are compared to generate the present programmable almost empty flag ($PAE\#_P$) and the present empty flag ($EF_P$).

Also during cycles QS-1, QS0 and QS1, the read counter value ($RCNT_N$) and the write counter value ($WCNT_N$) associated with the new queue are retrieved from memory. The new read counter value $RCNT_N$ and the new write counter value $WCNT_N$ become active during cycle QS2. The new read counter value $RCNT_N$ and the new write counter value $WCNT_N$ are compared to generate a new programmable almost empty flag value ($PAE\#_N$) and a new empty flag value ($EF_N$), which also become active during cycle QS2. Thus, during cycle QS2, the programmable almost empty flag PAE# and the empty flag EF represent the status of the new queue, even though the data value PQ4 is read from the present queue during cycle QS2.

A problem will exist if the present queue is not empty during cycle QS2, and the data value PQ4 is provided as an output value. An internal counter needs to keep track of this read operation for the present queue, and at the same time provide count values for new queue flag calculation. This problem has been solved by using a pipeline scheme at the output terminals of the write counter and the read counter, and by specifying a forced-word-fall-through (FWFT) restriction on the data output during a queue switch. Thus, if the present queue is not empty, the last data before queue switch will be output in cycle QS2 even though there is no active external read signal. This enables the read counter to predict what happens during cycle QS2, instead of relying on what actually occurs during cycle QS2. However, this scheme undesirably requires the user to process data during cycle QS2.

It would therefore be desirable to have a multi-queue FIFO memory system that is capable of determining exactly how many read operations have been performed on the present queue, without any prediction or forced data out.

Traditionally, if data is written to a multi-queue memory system, and the system detects an error, the data cannot be re-written, unless the entire device is reset and the write is performed again. Similarly, once data is read out of a multi-queue FIFO memory system, and the system detects an error during the data transmission, the erroneous data cannot be re-read.

It would therefore be desirable to have a multi-queue FIFO memory that is capable of being re-written and re-read.

SUMMARY

Accordingly, the present invention provides a multi-queue memory device that enables mark/re-write and mark/re-read operations to be performed. When accessing a new queue (e.g., during a write or read queue switch), the system has the option to mark the new (write or read) queue. In one embodiment, a write queue is marked by controlling a write address enable signal, and a read queue is marked by controlling a read address enable signal. When the access to the new queue is complete (e.g., during the next queue switch), a re-write (or re-read) operation may be requested. In one embodiment, a re-write operation is requested by controlling a write enable signal, and a re-read operation is requested by controlling a read enable signal.

Note that if the queue is not initially marked, the system cannot subsequently request a re-write (or re-read) operation. A mark operation performed at the read port is independent of a mark operation performed at the write port. The system may mark both the write and read queues, or either one of these queues individually.

In one embodiment, a plurality of read count pointers are stored in a read address file, wherein each read count pointers corresponds with one of the queues of the multi-queue memory system. Each read count pointer is used to generate an empty flag (and programmable almost empty flag) for the associated queue. When accessing a first queue, a read count pointer associated with the first queue is retrieved from the read address file. If it is determined that the first queue should be available for a re-read operation, then the initially retrieved read count pointer is stored as a first read mark value. This first read mark value is then used to generate the empty flag (and programmable almost empty flag) associated with the first queue. The read count pointer is incremented in response to each read operation performed from the first queue, thereby creating an adjusted read count pointer. If a re-read operation is subsequently requested from the first queue, the first read mark value is stored in the read address file. Otherwise, the adjusted first read count pointer is stored in the read address file. During a queue switch operation, the above-described process is performed in parallel for the next queue.

Similar operations are performed on the write side of the multi-queue memory system.

The above-described mark/re-write and mark/re-read operations can be used to improve the quality of written, or read data. If too many write/read errors are detected, a re-write/re-read operation can be performed, starting at the marked location.

The present invention will be more fully understood in view of the following description and drawings.

DETAILED DESCRIPTION

The present invention includes a multi-queue flow-control device, which is implemented on a single chip. The multi-queue device can be configured to implement between 1 and 128 discrete FIFO queues. The user has full flexibility configuring queues within the device, being able to program the total number of queues between 1 and 128. The user can also independently select the individual queue depths.

All queues within the device have a common data input bus (write port), and a common data output bus (read port). Data written to the write port is directed to a respective queue via an internal de-multiplexer, which is addressed by a user. Data read from the read port is accessed from a respective queue via an internal multiplexer, addressed by the user. Data writes and reads can be performed at high speeds (up to 200 MHz, with access times of 3.6 ns in accordance with one embodiment of the present invention). Data write and read operations are totally independent of each other. Thus, a queue may be selected on the write port, and a different queue may be selected on the read port. Alternately, read and write operations may be selected on the same queue simultaneously.

The device provides a Full Flag (FF#) and an Empty Flag (EF#) that identify the status of the queues selected for write and read operations, respectively. The device also provides a Programmable Almost Full Flag (PAF#) and a Programmable Almost Empty Flag (PAE#) that identify the status of the queues selected for write and read operations, respectively. The positions of the PAF# and PAE# flags are programmable by the user. The flags for queue N are specified by the flag name, followed by N (e.g., PAF#_N).

Figure 1:
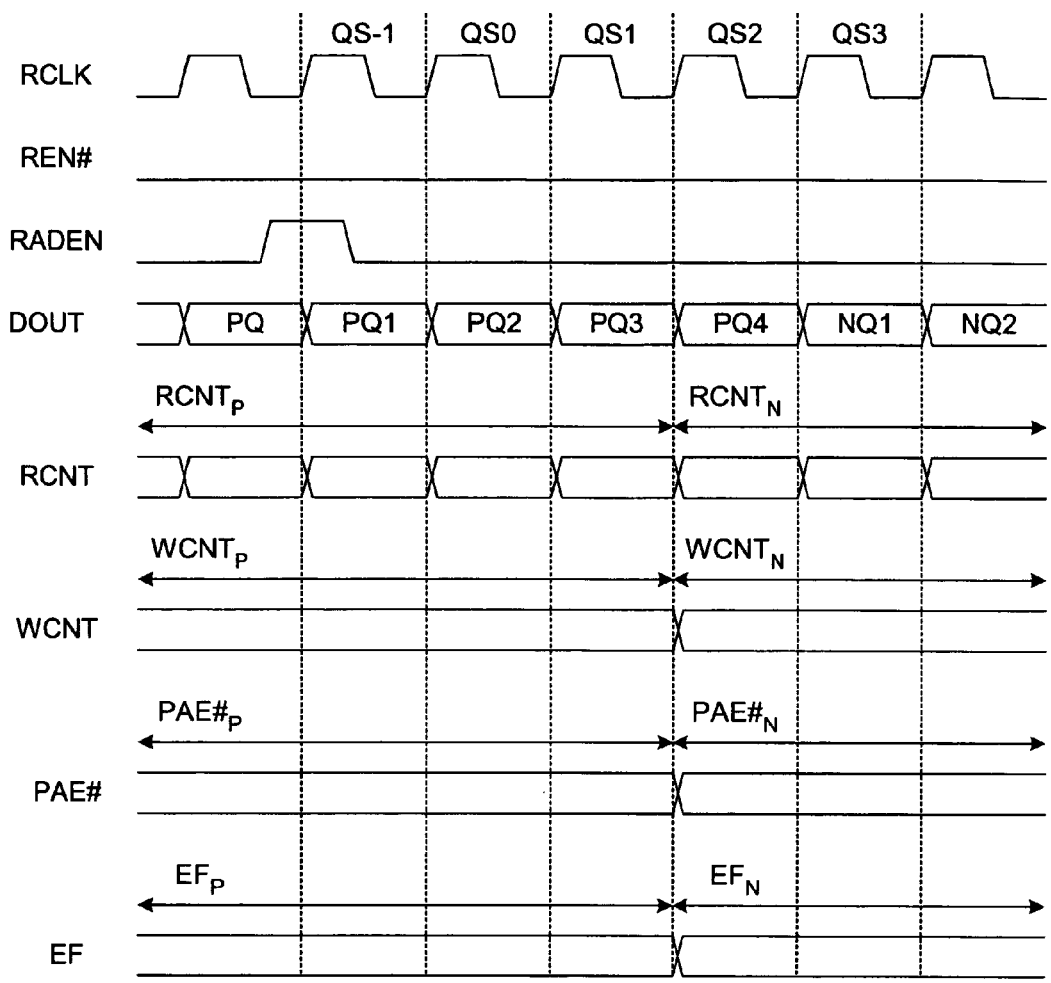
FIG. 1 is a waveform diagram illustrating a typical queue switch performed during a read operation.
Figure 2:
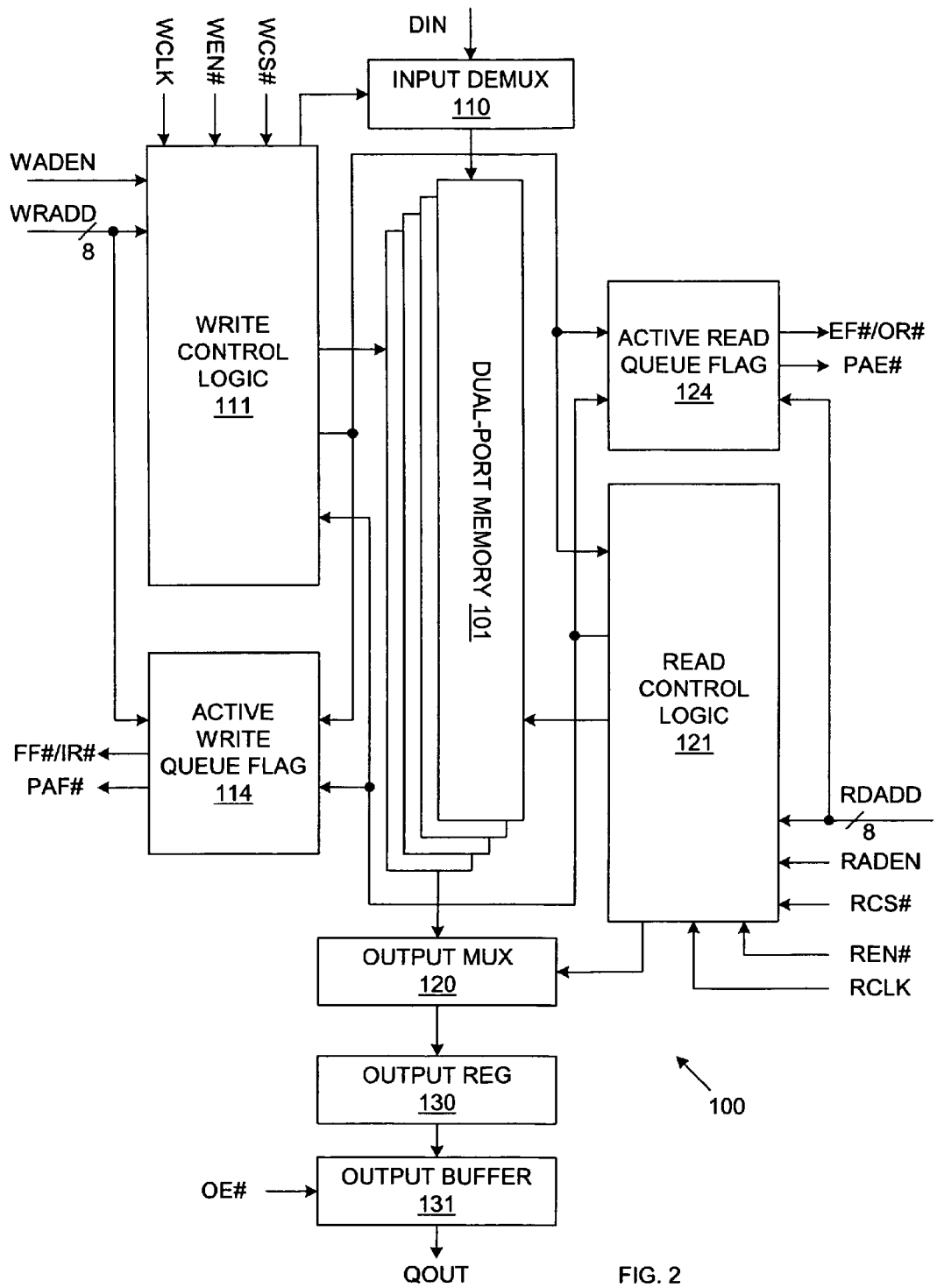
FIG. 2 is a block diagram of a multi-queue flow-control device in accordance with one embodiment of the present invention.

FIG. 2 is a block diagram of a multi-queue flow-control device 100 in accordance with one embodiment of the present invention. Device 100 includes dual-port memory 101, write port (de-multiplexer) 110, write control logic 111, active write queue flag circuit 114, output multiplexer 120, read control logic 121, active read queue flag circuit 124, output register 130 and output buffer 131. In the described embodiment, dual-port memory is a 4.7 Mbit memory, which can be logically divided into up to 128 FIFO queues, each having a minimum capacity of 9 k bits.

In general, write control logic 111 controls write accesses to the various queues in dual-port memory 101. More specifically, write control logic 111 provides the required control/address signals to input de-multiplexer 110 and dual-port memory 101 in response to a write chip select signal WCS#, a write enable signal WEN#, a write clock signal WCLK, a write address signal WRADD[7:0] and a write address enable signal WADEN. As described in more detail below, write control logic 111 also provides control signals to active write queue flag circuit 114, active read queue flag circuit 124 and read control logic 121.

Similarly, read control logic 121 controls read accesses from the various queues in dual-port memory 101. More specifically, read control logic 121 provides the required control/address signals to output multiplexer 120 and dual-port memory 101 in response to a read chip select signal RCS#, a read enable signal REN#, a read clock signal RCLK, a read address signal RDADD[7:0] and a read address enable signal RADEN. As described in more detail below, read control logic 121 also provides control signals to active write queue flag circuit 114, active read queue flag circuit 124 and write control logic 111.

As described in more detail below, active write queue flag circuit 114 generates a full flag FF# (input ready flag IR#) and programmable almost full flag PAF# in response to the write address WRADD[7:0] and the control signals received by write control logic 111 and read control logic 121. Also, as described in more detail below, active read queue flag circuit 124 generates an empty flag EF# (output ready flag OR#) and programmable almost empty flag PAE# in response to the read address RDADD[7:0] and the control signals received by write control logic 111 and read control logic 121.

Read operations to multi-queue device 100 will now be described. In general, when a queue within dual-port memory 101 is selected for a read operation, the next word in the selected queue automatically falls through output multiplexer 120 to the output register 130. All subsequent words from the selected queue require an enabled read cycle in order to be routed to the output register 130. Data cannot be read from the selected queue if the queue is empty. The active read queue flag circuit 124 provides an active-low empty flag/output ready signal (EF#/OR#) indicating when the data read from the selected queue is valid. If the user switches to a queue that is empty, the last word read from the previous queue will remain in the output register 130. As described in more detail below, dual-port memory 101 exhibits a four-cycle latency when switching from one queue to another queue (i.e., during a queue switch).

Figure 3:
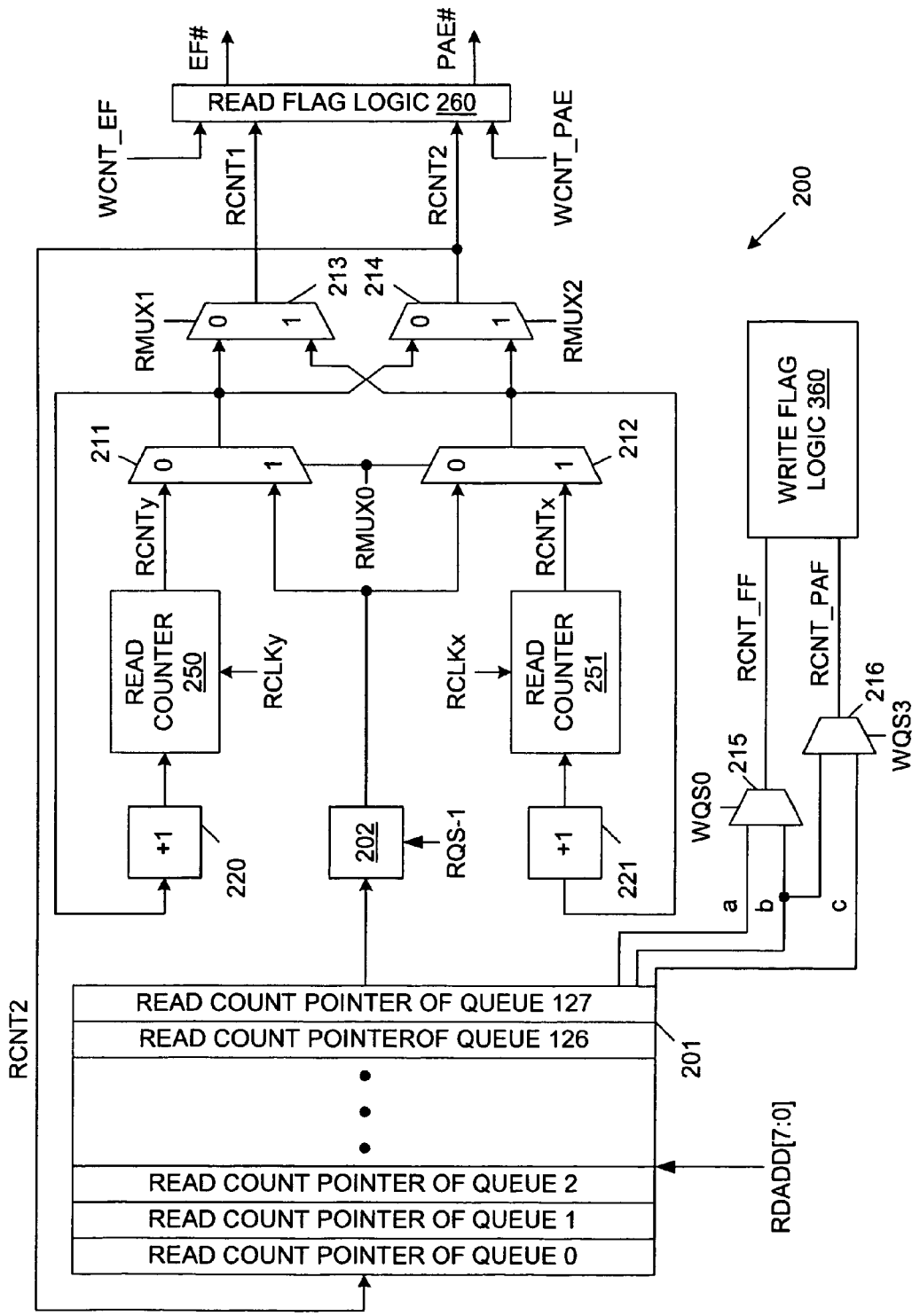
FIG. 3 is a block diagram of a read flag counter register (FCR) file having multiple read counters in accordance with one embodiment of the present invention.

FIG. 3 is a block diagram of a read flag counter register (FCR) system 200, which is located in read control logic block 121 and active read queue flag circuit 124, in accordance with one embodiment of the present invention. Read FCR system 200 includes read FCR file 201, register 202, multiplexers 211-214, adder circuits 220-221, read counters 250-251 and read flag logic 260.

Read FCR file 201 includes 128 entries, one for each possible queue in multi-queue device 100. Each entry stores a read count pointer for a corresponding queue. Each entry of read FCR file 201 is coupled to register 202 via a selection circuit (not shown). As described in more detail below, register 202 latches a read count pointer retrieved from read FCR file 201 at the start of a queue switch (during cycle QS-1). The read count pointer stored in register 202 is applied to the "1" input terminal of multiplexer 211 and the "0" input terminal of multiplexer 212.

The output terminal of multiplexer 211 is coupled to the "0" input terminals of multiplexers 213 and 214 and to adder 220. Similarly, the output terminal of multiplexer 212 is coupled to the "1" input terminals of multiplexers 213 and 214 and to adder 221. Adders 220 and 221 each add one to the read count values provided by multiplexers 211 and 212, respectively. Adders 220 and 221 apply the incremented read count values to read counters 250 and 251, respectively. Read counters 250 and 251 latch the incremented read count values on rising edges of the RCLKy and RCLKx read clock signals, respectively. Read counters 250 and 251 apply output read count values RCNTy and RCNTx, respectively, to the "0" and "1" input terminals of multiplexers 211 and 212, respectively. In the described embodiment, multiplexers 211 and 212 are controlled by the same control signal RMUX0, although this is not necessary. Multiplexers 213 and 214 are controlled by RMUX1 and RMUX2 signals, respectively. Multiplexer 213 provides an output signal RCNT1, and multiplexer 214 provides an output signal RCNT2, which are used to derive the empty flag, EF# and the programmable almost empty flag, PAE#, respectively. The RCNT2 signal is also routed back to read FCR file 201, such that the read address register file is updated to store changes in the RCNT2 signal during each read cycle (as long as the associated queue is not marked).

Figure 4:
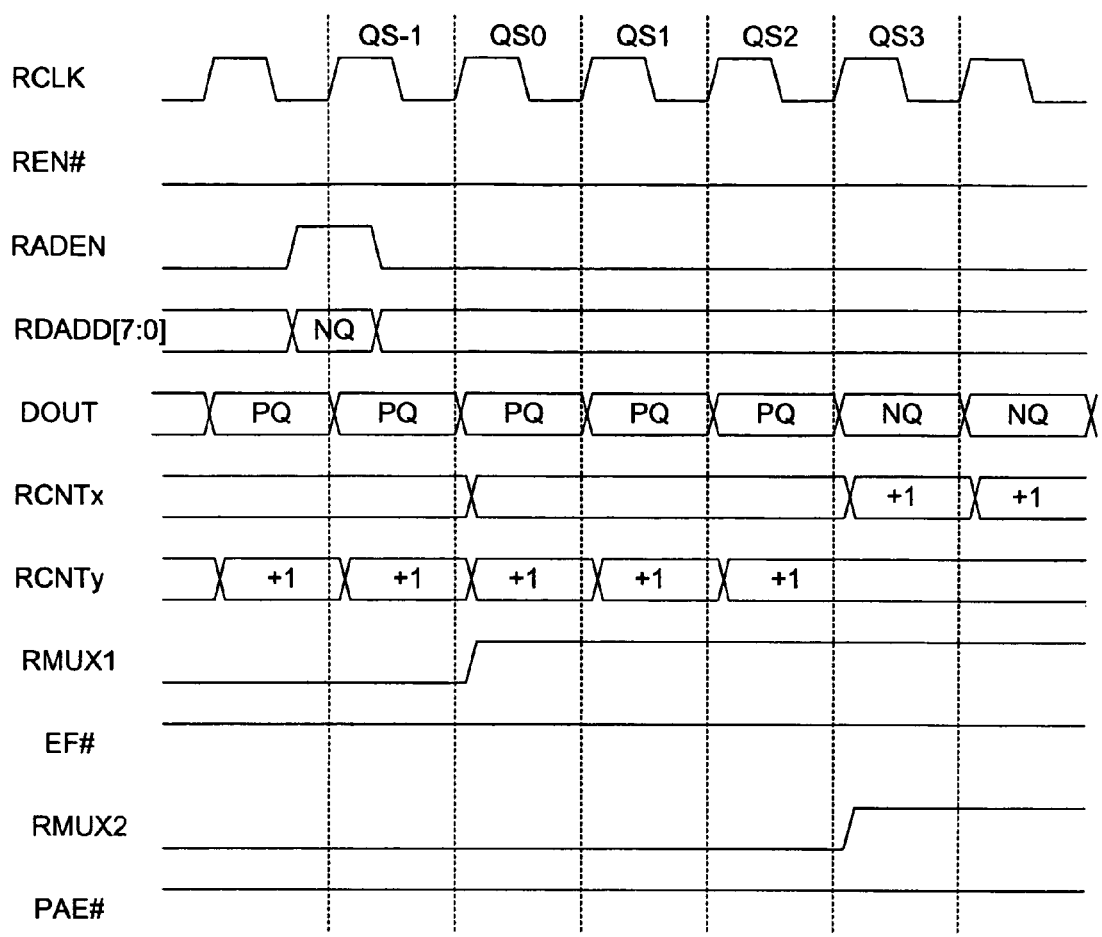
FIGS. 4, 5, 6, 7 are waveform diagrams illustrating the operation of the read FCR file of FIG. 3 in accordance with various embodiments of the present invention.

FIG. 4 is a waveform diagram illustrating the operation of read FCR system 200 in accordance with one embodiment of the present invention.

Figure 8:
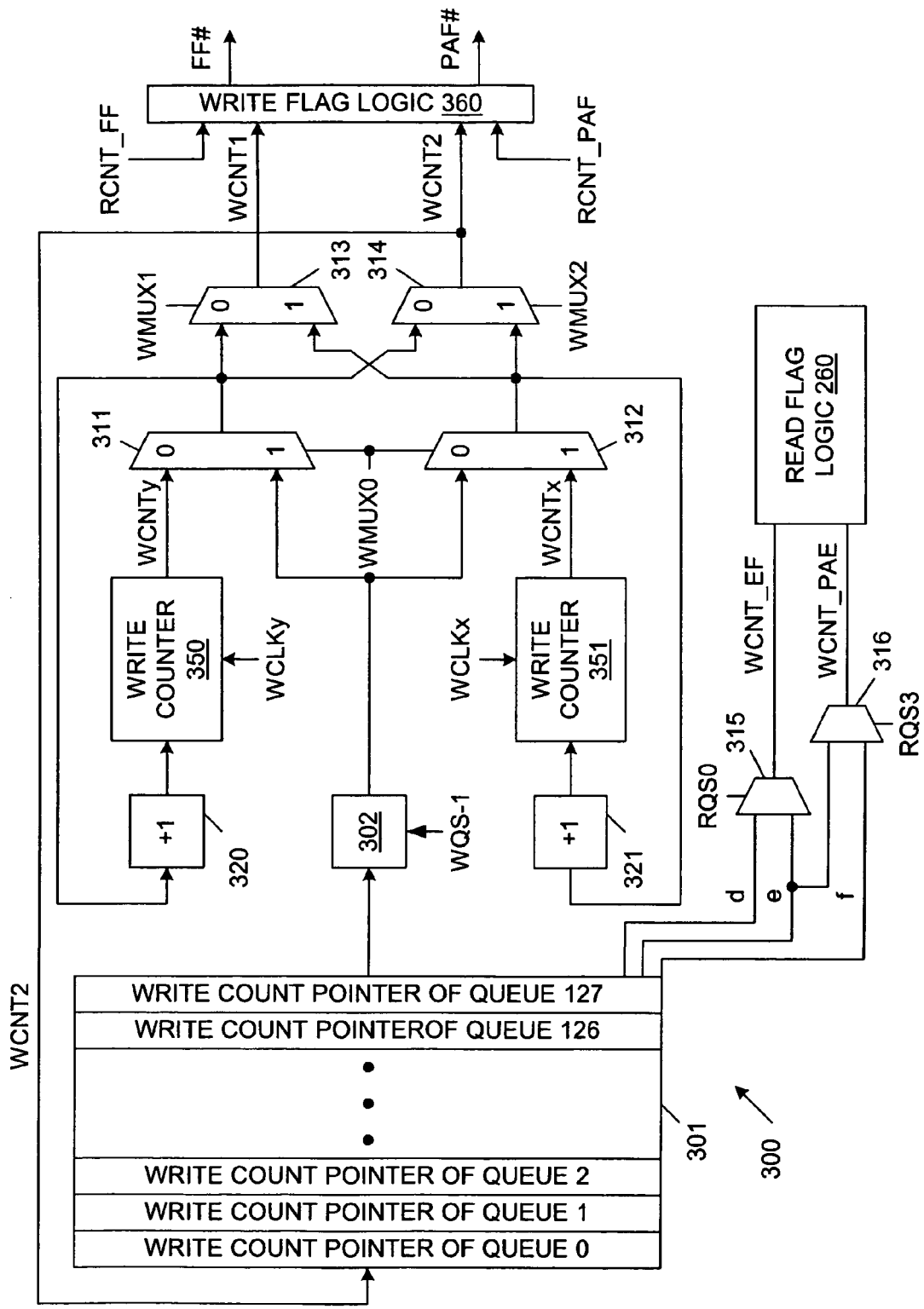
FIG. 8 is a block diagram of a write flag counter register (FCR) file in accordance with one embodiment of the present invention.

The read clock signal RCLK, read enable signal REN#, read address enable signal RADEN and read address signal RDADD[7:0] are applied to read control logic 121 (FIG. 2). Relevant cycles of the RCLK signal are labeled QS-1, QS0, QS1, QS2 and QS3. Prior to read cycle QS-1, data is being read from a first queue, which is hereinafter referred to as the present queue (PQ). At this time, read FCR system 200 is configured as follows. The read clock signal RCLK is routed as the read clock signal RCLKy to read counter 250. Read counter 250 maintains a read count value (RCNTy) associated with the present queue PQ. The RMUX0 signal has a logic "0" value, such that multiplexer 211 routes the RCNTy value provided by read counter 250 to multiplexers 213 and 214. The RMUX1 and RMUX2 signals both have a logic "0" value, such that multiplexers 213 and 214 route the RCNTy value as the RCNT1 and RCNT2 signals, respectively, to read flag logic 260. At this time, read flag logic 260 generates the empty flag EF# and programmable almost empty flag PAE# in response to the read count value RCNTy associated with the present queue PQ. More specifically, read flag logic 260 generates the empty flag EF# in response to the RCNT1 signal and a write pointer value WCNT_EF provided by a write FCR system 300 (FIG. 8). Similarly, read flag logic 260 generates the programmable almost empty flag PAE# in response to the RCNT2 signal and another write pointer value WCNT_PAE provided by the write FCR file. In general, WCNT_EF is the write count pointer of the same queue represented by the RCNT1 read count pointer, and WCNT_PAE is the write count pointer of the same queue represented by the RCNT2 read count pointer. The operation of multiplexers 315 and 316 is described in more detail in "Method to Optimize Interfaces Between Driver and Receiver Circuits in Datapaths" by Prashant Shamarao, Jason Z. Mo and Jianghui Su, U.S. Provisional Patent Application Ser. No. 60/555716, filed Mar. 23, 2004, which is hereby incorporated by reference.

Each time that a read operation is performed from the present queue PQ, the read clock signal RCLKy is asserted, thereby causing read counter 250 to latch the incremented read count value (i.e., RCNTy plus 1) provided by adder circuit 220. Read flag logic 260 then uses the incremented RCNTy signal to generate the EF# and PAE# flags associated with the present queue PQ. In the present example, the EF# and PAE# flags associated with the present queue PQ remain de-activated high, thereby indicating that the present queue is neither empty nor almost empty.

Prior to the start of read cycle QS-1, the read address enable signal RADEN transitions to a logic "1" state, thereby indicating that a queue switch (QS) will be performed. That is, the read operations from the present queue PQ will be stopped, and read operations will be performed from a new queue (NQ) in dual port memory 101. The address of the new queue NQ is identified by the read address signal RDADD[7:0]. The RADEN and RDADD[7:0] signals are detected at the beginning of read cycle QS-1 (at the rising edge of the RCLK signal).

In response to the detected RADEN signal, read FCR file 201 retrieves the read count pointer from the register corresponding to the queue identified by the RDADD[7:0] signal. For example, if the read address signal RDADD[7:0] identifies queue 2, then read FCR file 201 provides the read count pointer of queue 2 to register 202. The write FCR system 300 (FIG. 8) also retrieves the write count pointer associated with the addressed queue (e.g., queue 2) on port "d" at this time. Data is read from the present queue and the read count value RCNTy is incremented during read cycle QS-1.

By the start of the next read cycle QS0, the read count pointer retrieved from read FCR file 201 has been loaded into register 202. At this time, multiplexer 212 routes the read count pointer stored in register 202 to the logic "1" input terminals of multiplexers 213 and 214, and to the input terminal of adder circuit 221. Also at the start of read cycle QS0, the RMUX1 signal transitions to a logic "1" value, thereby causing multiplexer 213 to route the newly retrieved read point counter associated with the new queue NQ as the RCNT1 signal. Also, at the start of read cycle QS0, the write FCR system 300 provides the newly retrieved write point counter associated with the new queue NQ as the WCNT_EF signal. In response, read flag logic 260 starts to generate a new empty flag EF# in response to the retrieved read and write count pointers associated with the new queue NQ. Data (DOUT) is still read from the present queue (and the read count value RCNTy is incremented) during read cycle QS0. Note that the RCNTy value associated with the present queue PQ signal (and provided as the RCNT2 signal) and a write count pointer associated with the present queue (WCNT_PAE) are still used to generate the programmable almost empty PAE# flag during the read cycle QS0.

During cycles QS1 and QS2, the read enable signal REN# remains activated low, thereby enabling data values to be read from the present queue PQ during cycles QS1 and QS2, and enabling read clock counter 250 to increment the RCNTy value at the rising edges of read cycles QS1 and QS2. As described in more detail below, the read enable signal REN# can be de-activated high prior to the beginning of a read cycle, thereby preventing data values from being read from the queue during the read cycle. In this case, the high REN# signal prevents the read clock signal RCLKy from clocking read counter 250, such that the read count value RCNTy is not incremented during the read cycle.

The last data value to be read from the present queue PQ is provided during read cycle QS2. The read count value RCNTy is routed through multiplexers 211 and 214 to read FCR file 201 as the RCNT2 signal. During read cycle QS2, the read count value RCNTy is stored as the read count pointer associated with the present queue PQ in read FCR file 201.

At the end of read cycle QS2, the read count value RCNTy provided by read counter 250 is representative of the exact number of read operations that have been performed to the present queue PQ, without any prediction, pipelining or forced data out. Consequently, the next time the present queue is accessed, the read count pointer retrieved from read FCR file 201 accurately represents the read address of this queue.

At the start of read cycle QS2, read flag logic 260 provides an empty flag EF# representative of the status of the new queue NQ. As described above, this empty flag EF# is provided in response to the read count pointer previously stored in register 202 during read cycle QS0 and provided as the RCNT1 signal.

Note that during cycle QS1, read flag logic 260 decodes the address of the new queue NQ, and retrieves a previously stored programmable almost empty flag PAE#, which identifies the almost empty status of the new queue NQ. During cycle QS2, read flag logic 260 provides the PAE# flag associated with the new queue as the active PAE# flag. The active PAE# flag associated with the new queue is then updated during cycle QS3 (and during subsequent cycles) This process provides an accurate result, because the earliest that a read operation can be performed to the new queue is during cycle QS3. The logic used to generate the programmable almost empty flag is described in more detail in U.S. patent application Ser. No. 11/040,804, now U.S. Pat. No. 7,257,687 entitled, "Synchronization of Active Flag and Status Bus Flags in a Multi-Queue First-In First-Out Memory System", by Mario Au, Jason Z. Mo and Cheng-Han Wu, which is hereby incorporated by reference.

Also during read cycle QS2, a write count pointer associated with the new queue is retrieved on port "f" of the write FCR system 300.

During read cycle QS3, data is read from the new queue NQ. More specifically, data is read from the address of the new queue NQ identified by the read count pointer stored in register 202. At the start of read cycle QS3, the read clock signal RCLK is routed to read counter 251 as the read clock signal RCLKx. At the rising edge of read cycle QS3, read counter 251 latches an incremented read count value (RCNTx plus 1) provided by adder circuit 221. During read cycle QS3, the RMUX0 signal is controlled to have a logic "1" state, thereby causing multiplexer 212 to route the incremented read count value RCNTx from read counter 251 to multiplexers 213 and 214. The multiplexer control signal RMUX2 is also controlled to have a logic "1" value, thereby causing multiplexer 214 to route the incremented read count value RCNTx associated with the new queue to read flag logic 260. The write count pointer associated with the new queue is retrieved on port "f" of the write FCR system 300 and provided to read flag logic 260 as the write count pointer WCNT_PAE during cycle QS3. Read flag logic 260 then begins to generate the programmable almost empty flag PAE# in response to the new read count pointer RCNT2 and the new write count pointer WCNT_PAE.

Figure 5:
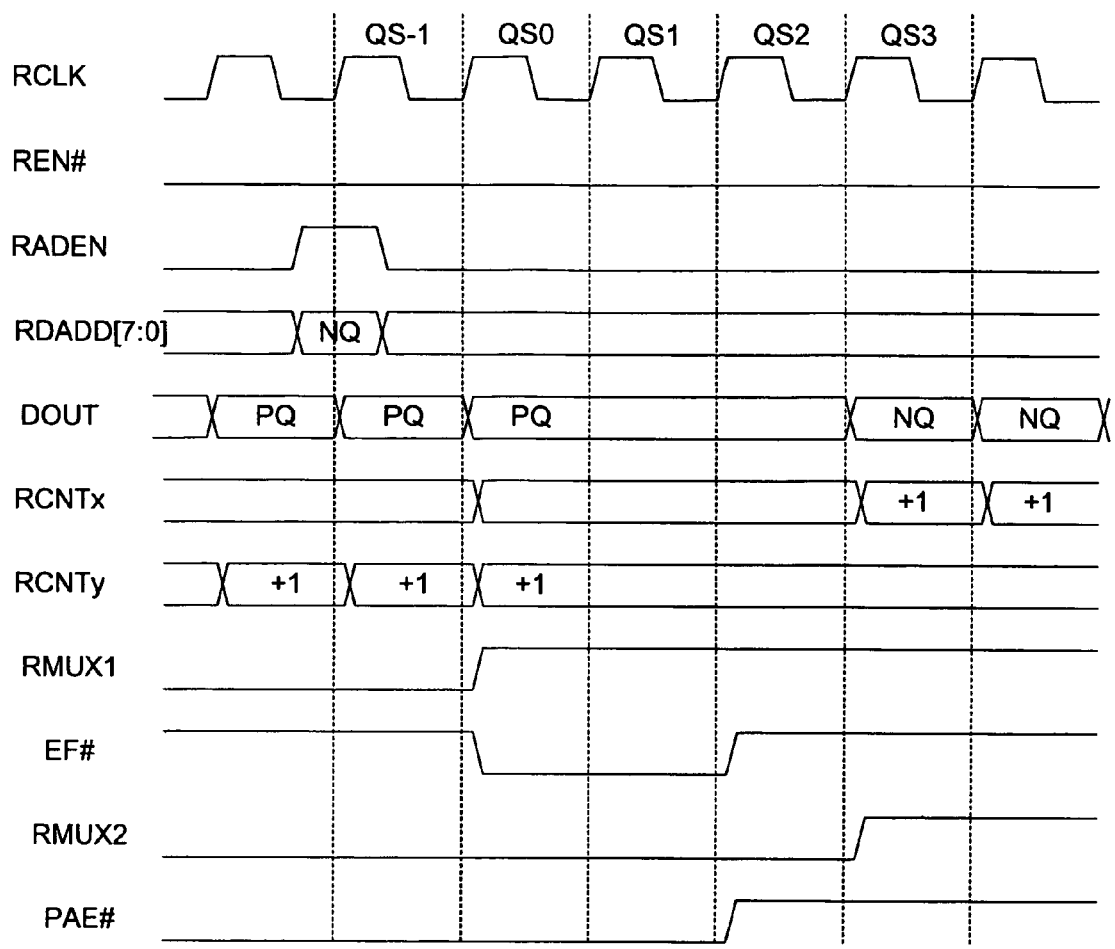

FIG. 5 is a waveform diagram illustrating the operation of read FCR system 200 in accordance with another embodiment of the present invention. The embodiment of FIG. 5 is similar to the embodiment of FIG. 4, with differences noted below. In the embodiment of FIG. 5, the last data value in the present queue PQ is read during read cycle QS0. Because the present queue becomes empty during read cycle QS0, the empty flag EF# is activated low during this read cycle. Note that the programmable almost empty flag PAE# was activated low in previous read cycles. The logic low empty flag EF# prevents additional data values from being read from the present queue, and prevents the read count value RCNTy from being incremented. This is accomplished by basic FIFO read logic, which feeds back the status of the empty flag EF# to prevent read operations from occurring (i.e., an internal read is only activated if the empty flag EF# is high and the read enable signal REN# is low).

The new queue NQ is neither empty nor almost empty in the example of FIG. 5. Consequently, the empty flag EF# and programmable almost empty flag PAE# are activated high during read cycle QS2, thereby indicating the non-empty status of the new queue NQ. A data value is read from the new queue NQ during read cycle QS3 in the manner described above in connection with FIG. 4.

Figure 6:
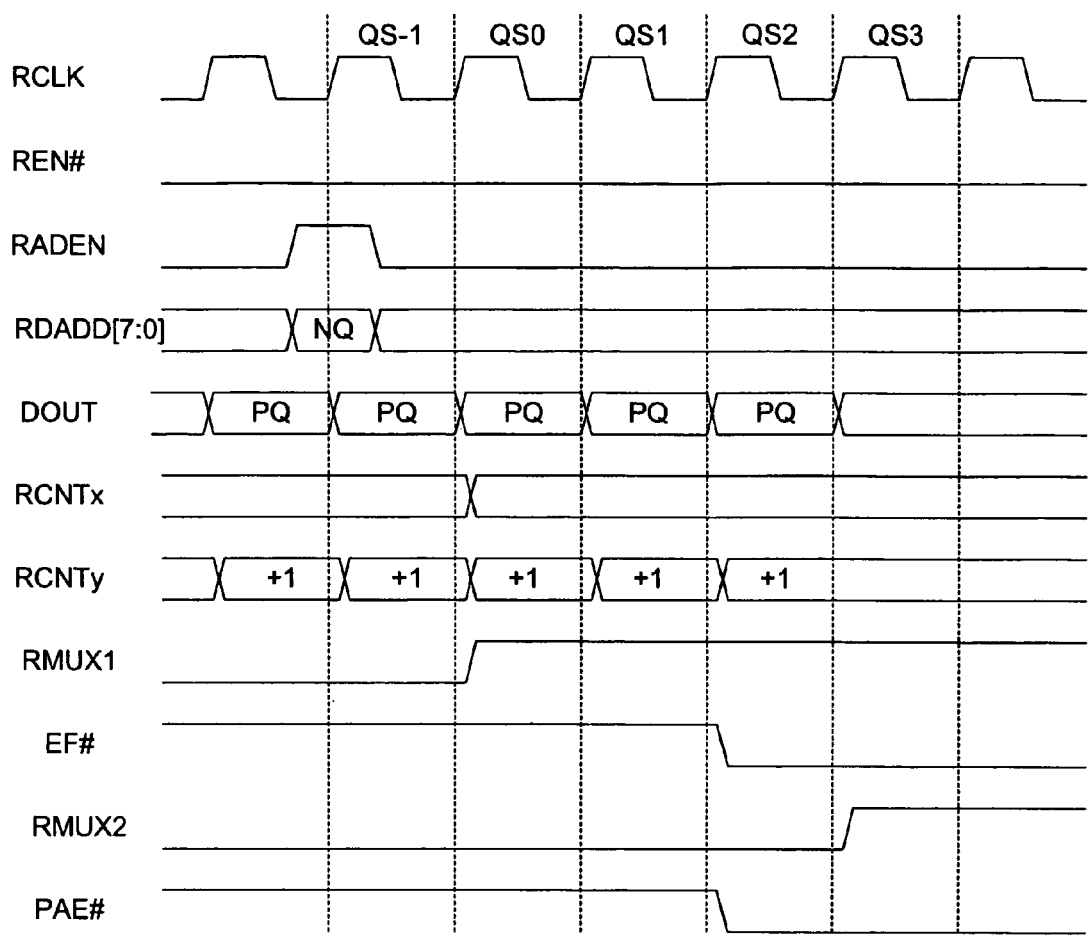

FIG. 6 is a waveform diagram illustrating the operation of read FCR system 200 in accordance with another embodiment of the present invention. The embodiment of FIG. 6 is similar to the embodiment of FIG. 4, with differences noted below. In the embodiment of FIG. 6, data values are read from the present queue PQ through read cycle QS2 in the manner described above in connection with FIG. 4. However, in the example of FIG. 6, the new queue is empty during cycle QS3. Because the new queue is empty, the empty flag EF# and the programmable almost empty flag PAE# are activated low during read cycle QS2. The logic low empty flag EF# prevents data values from being read from the new queue, and prevents the read count value RCNTx from being incremented.

Figure 7:
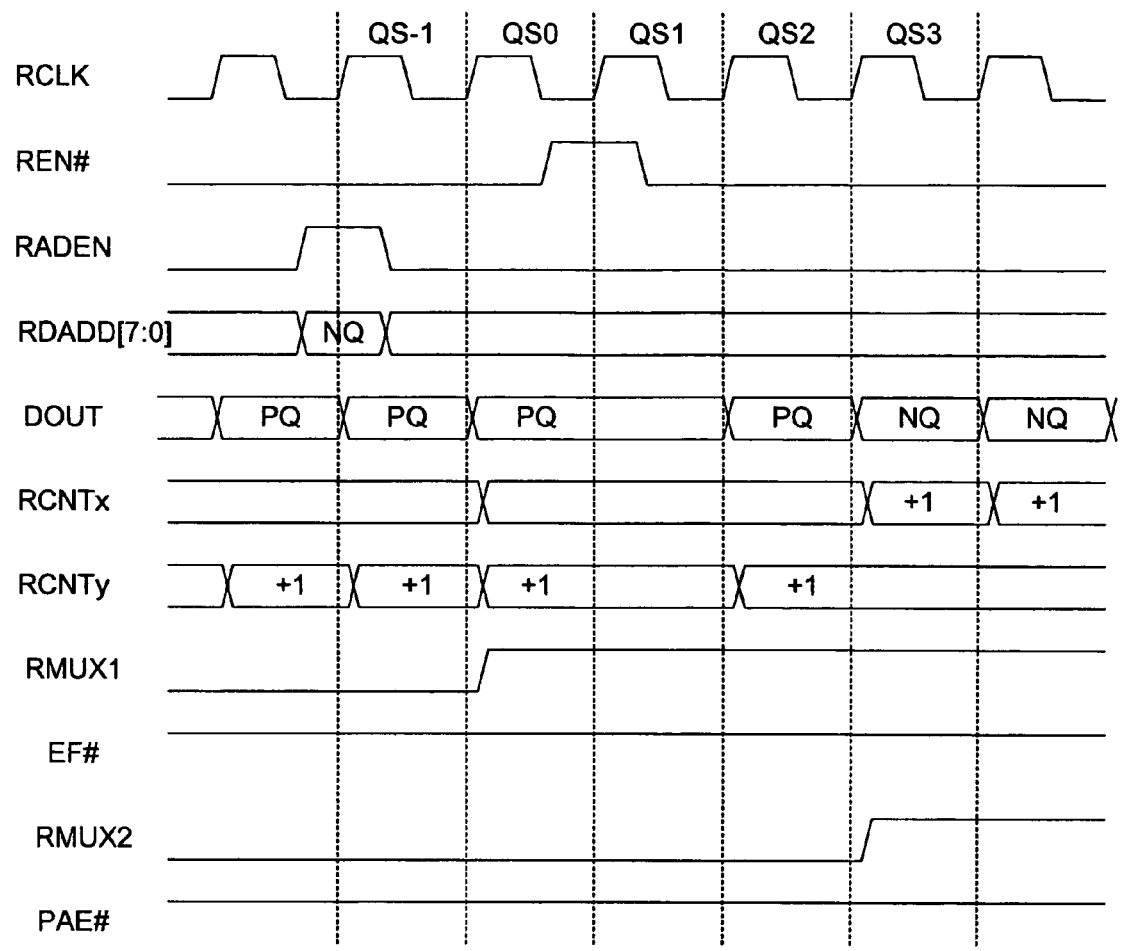

FIG. 7 is a waveform diagram illustrating the operation of read FCR system 200 in accordance with another embodiment of the present invention. The embodiment of FIG. 7 is similar to the embodiment of FIG. 4, with differences noted below. In the embodiment of FIG. 7, the read enable signal REN# is de-activated high prior to the rising edge of read cycle QS1. The logic high read enable signal REN# prevents a new data value from being read from the present queue during read cycle QS1, and prevents the read count value RCNTy from being incremented during read cycle QS1.

In the foregoing manner, a read queue switch can be implemented in a seamless and flexible manner, without requiring forced data fall through or pipelining the output data.

FIG. 8 is a block diagram of a write flag counter register (FCR) system 300, which is located in write control logic block 111 and active queue flag circuit 114, in accordance with one embodiment of the present invention. Write FCR system 300 includes write FCR file 301, register 302, multiplexers 311-314, adder circuits 320-321, write counters 350-351, and write flag logic 360. Write FCR system 300 is configured in the same manner as read FCR system 200 (FIG. 3).

Write FCR file 301 includes 128 entries, one for each possible queue in device 100. Each entry stores a write count pointer for a corresponding queue. Each entry of write FCR file 301 is coupled to register 302 via a selection circuit (not shown). As described in more detail below, register 302 latches a new write count pointer retrieved from write FCR file 301 at the start of a queue switch (during cycle QS-1). The write count pointer stored in register 302 is applied to the "1" input terminal of multiplexer 311 and the "0" input terminal of multiplexer 312.

The output terminal of multiplexer 311 is coupled to the "0" input terminals of multiplexers 313 and 314, and to the input terminal of adder 320. The output terminal of multiplexer 312 is coupled to the "1" input terminals of multiplexers 313 and 314, and to the input terminal of adder 321. Adders 320 and 321 each add one to the write count values provided by multiplexers 311 and 312, respectively. Adders 320 and 321 apply the incremented write count values to write counters 350 and 351, respectively. Write counters 350 and 351 latch the incremented write count values on rising edges of the WCLKy and WCLKx write clock signals, respectively. Write counters 350 and 351 apply output write count values WCNTy and WCNTx, respectively, to the "0" and "1" input terminals of multiplexers 311 and 312, respectively. In the described embodiment, multiplexers 311 and 312 are controlled by the same control signal WMUX0, although this is not necessary. Multiplexers 313 and 314 are controlled by WMUX1 and WMUX2 signals, respectively. Multiplexer 313 provides an output signal WCNT1, and multiplexer 314 provides an output signal WCNT2, which are used to derive the full flag FF# and the programmable almost full flag PAF#, respectively. The WCNT2 signal is also routed back to write FCR file 301 as a write count signal, such that the write FCR file 301 is updated to store changes in the WCNT2 signal during each write cycle (as long as the associated queue is not marked).

Figure 9:
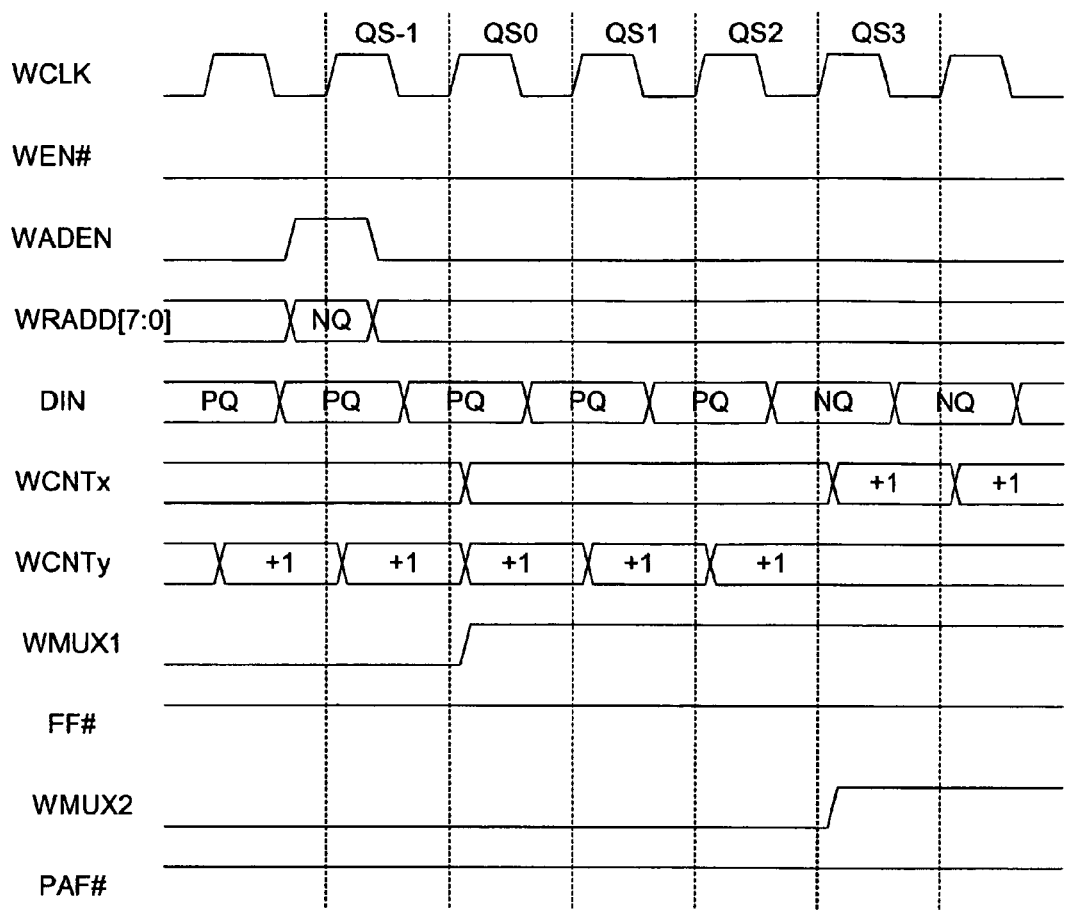
FIGS. 9, 10, 11, 12 are waveform diagrams illustrating the operation of the write FCR file of FIG. 8 in accordance with various embodiments of the present invention.

FIG. 9 is a waveform diagram illustrating the operation of write FCR system 300 in accordance with one embodiment of the present invention.

The write clock signal WCLK, write enable signal WEN#, write address enable signal WADEN and write address signal WRADD[7:0] are applied to write control logic 111 (FIG. 2). Relevant cycles of the WCLK signal are labeled QS-1, QS0, QS1, QS2 and QS3. Prior to write cycle QS-1, data is being written to a first queue in dual-port memory 101, which is hereinafter referred to as the present queue (PQ). At this time, write FCR system 300 is configured as follows. The write clock signal WCLK is routed as the write clock signal WCLKy to write counter 350. Write counter 350 maintains a write count value (WCNTy) associated with the present queue PQ. The WMUX0 signal has a logic "0" state, such that multiplexer 311 routes the WCNTy value provided by write counter 350 to multiplexers 313 and 314. The WMUX1 and WMUX2 signals both have a logic "0" value, thereby routing the WCNTy value as the WCNT1 and WCNT2 signals. Write flag logic 360 generates the full flag FF# and programmable almost full flag PAF# in response to the write count value WCNTy associated with the present queue PQ.

Each time that a write operation is performed to the present queue PQ, the write clock signal WCLKy is asserted, thereby causing write counter 350 to latch the incremented write count value (i.e., WCNTy plus 1) provided by adder circuit 320. The incremented WCNTy signal is then used to generate the FF# and PAF# flags associated with the present queue PQ. In the present example, the FF# and PAF# flags associated with the present queue PQ remain de-activated high, thereby indicating that the present queue is neither full nor almost full.

Prior to the start of write cycle QS-1, the write address enable signal WADEN transitions to a logic "1" state, thereby indicating that a queue switch (QS) will be performed. That is, the write operations to the present queue PQ will be stopped, and write operations will be performed to a new queue (NQ) in dual port memory 101. The address of the new queue NQ is identified by the write address signal WRADD[7:0]. The WADEN and WRADD[7:0] signals are detected at the beginning of write cycle QS-1 (at the rising edge of the WCLK signal).

In response to the detected WADEN signal, write FCR file 301 retrieves the write count value from the register corresponding to the queue identified by the WRADD[7:0] signal. For example, if the write address signal WRADD[7:0] identifies queue 127, then write FCR file 301 provides the write count value of queue 127. The read FCR system 200 (FIG. 3) also retrieves the read count pointer associated with the addressed queue (e.g., queue 127) on port "a" at this time.

Data is written to the present queue and the write count value WCNTy is incremented during write cycle QS-1.

By the start of the next write cycle QS0, the write count pointer retrieved from write FCR file 301 has been loaded into register 302. In response to the logic "0" WMUX0 signal, multiplexer 312 routes the write count pointer stored in register 302 to the logic "1" input terminals of multiplexers 313 and 314, and to the input terminal of adder circuit 321. Also at the start of the next write cycle QS0, the WMUX1 signal transitions to a logic "1" value, thereby routing the newly retrieved write count pointer in register 302 associated with the new queue NQ as the WCNT1 signal. Also, at the start of read cycle QS0, the read FCR system 200 provides the newly retrieved read point counter associated with the new queue NQ as the RCNT_FF signal. In response, write flag logic 360 starts to generate a new full flag FF# in response to the retrieved read and write count pointers associated with the new queue NQ. Data (DIN) is written to the present queue (and the write count value WCNTy is incremented) during the QS0 write cycle. Note that the WCNTy value associated with the present queue PQ signal (and provided as the WCNT2 signal) and a write count pointer associated with the present queue (RCNT_PAF) are still used to generate the programmable almost full PAF# flag during the read cycle QS0.

During cycles QS1 and QS2, the write enable signal WEN# remains activated low, thereby enabling data values to be written to the present queue PQ during cycles QS1 and QS2, and enabling write clock counter 350 to increment the WCNTy value at the rising edges of write cycles QS1 and QS2. As described in more detail below, the write enable signal WEN# can be de-activated high prior to the beginning of a write cycle, thereby preventing data values from being written to the queue during the write cycle. In this case, the high WEN# signal prevents the write clock signal WCLKy from clocking write counter 350, such that the write count value WCNTy is not incremented during the write cycle.

The last data value to be written to the present queue PQ is written during write cycle QS2. The write count value WCNTy is routed through multiplexers 311 and 314 as the write count value WCNT2 to write FCR file 301. During write cycle QS2, the write count value WCNTy is stored as the write count pointer associated with the present queue PQ in write FCR file 301.

At the end of write cycle QS2, the write count value WCNTy provided by write counter 350 is representative of the exact number of write operations that have been performed to the present queue PQ, without any prediction or pipelining. Consequently, the next time the present queue is written, the write count pointer retrieved from write FCR file 301 accurately represents the last write address for this queue.

At the start of write cycle QS2, write flag logic 360 provides a full flag FF# representative of the status of the new queue NQ. As described above, this full flag FF# is provided in response to the write count pointer previously stored in register 302 during read cycle QS0 and provided as the WCNT1 signal.

Note that during cycle QS1, write flag logic 360 decodes the address of the new queue NQ, and retrieves a previously stored programmable almost full flag PAF#, which identifies the almost full status of the new queue NQ. During cycle QS2, write flag logic 360 provides the PAF# flag associated with the new queue as the active PAF# flag. The active PAF# flag associated with the new queue is then updated during cycle QS3 (and during subsequent cycles) This process provides an accurate result, because the earliest that a write operation can be performed to the new queue is during cycle QS3. The logic used to generate the programmable almost full flag is described in more detail in U.S. patent application Ser. No. 11/040,804, now U.S. Pat. No. 7,257,687 entitled, "Synchronization of Active Flag and Status Bus Flags in a Multi-Queue First-In First-Out Memory System", by Mario Au, Jason Z. Mo and Cheng-I-Tan Wu, which is hereby incorporated by reference.

Also during write cycle QS2, a read count pointer associated with the new queue is retrieved on port "c" of the read FCR system 200.

During write cycle QS3, data is written to the new queue NQ. More specifically, data is written to the address of the new queue NQ identified by the write count pointer stored in register 302. At the start of write cycle QS3, the write clock signal WCLK is routed to write counter 351 as the write clock signal WCLKx. At the rising edge of write cycle QS3, write counter 351 latches an incremented write count value (WCNTx plus 1) provided by adder circuit 321. During write cycle QS3, the WMUX0 signal is controlled to have a logic "1" value, thereby causing multiplexer 312 to route the incremented write count value WCNTx from write counter 351 to multiplexers 313 and 314. The multiplexer control signal WMUX2 is controlled to have a logic "1" value, thereby routing the incremented write count value WCNTx to write flag logic 360. The read count pointer associated with the new queue is retrieved on port "c" of the read FCR system 200 and provided to write flag logic 360 as the read count pointer RCNT_PAF during cycle QS3. Write flag logic 360 then begins to generate the programmable almost full flag PAF# in response to the new write count pointer RCNT2 and the new read count pointer RCNT_PAF.

Figure 10:
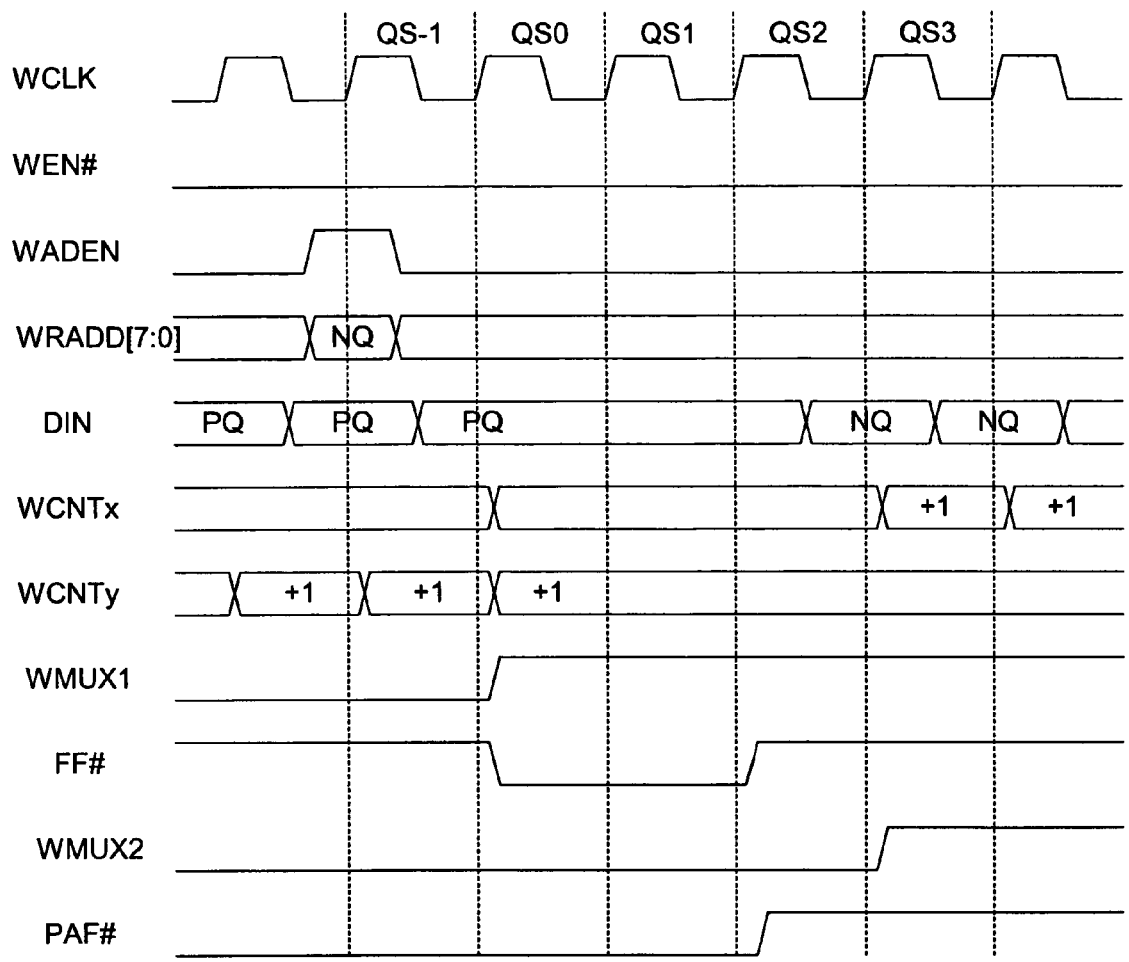

FIG. 10 is a waveform diagram illustrating the operation of write FCR system 300 in accordance with another embodiment of the present invention. The embodiment of FIG. 10 is similar to the embodiment of FIG. 9, with differences noted below. In the embodiment of FIG. 10, the last data value written to the present queue PQ is written during write cycle QS0. Because the present queue is full during write cycle QS0, the full flag FF# is activated low during this write cycle. Note that the programmable almost full flag PAF# was activated low in previous write cycles. The logic low full flag FF# prevents additional data values from being written to the present queue, and prevents the write count value WCNTy from being incremented. This is accomplished by basic FIFO read logic, which feeds back the status of the full flag FF# to prevent write operations from occurring (i.e., an internal write is only activated if the full flag FF# is high and the write enable signal WEN# is low).

The new queue NQ is neither full nor almost full in the example of FIG. 10. Consequently, the full flag FF# and programmable almost full flag PAF# are de-activated high during write cycle QS2, thereby indicating the non-full status of the new queue NQ. A data value is written to the new queue NQ during write cycle QS3 in the manner described above in connection with FIG. 9.

Figure 11:
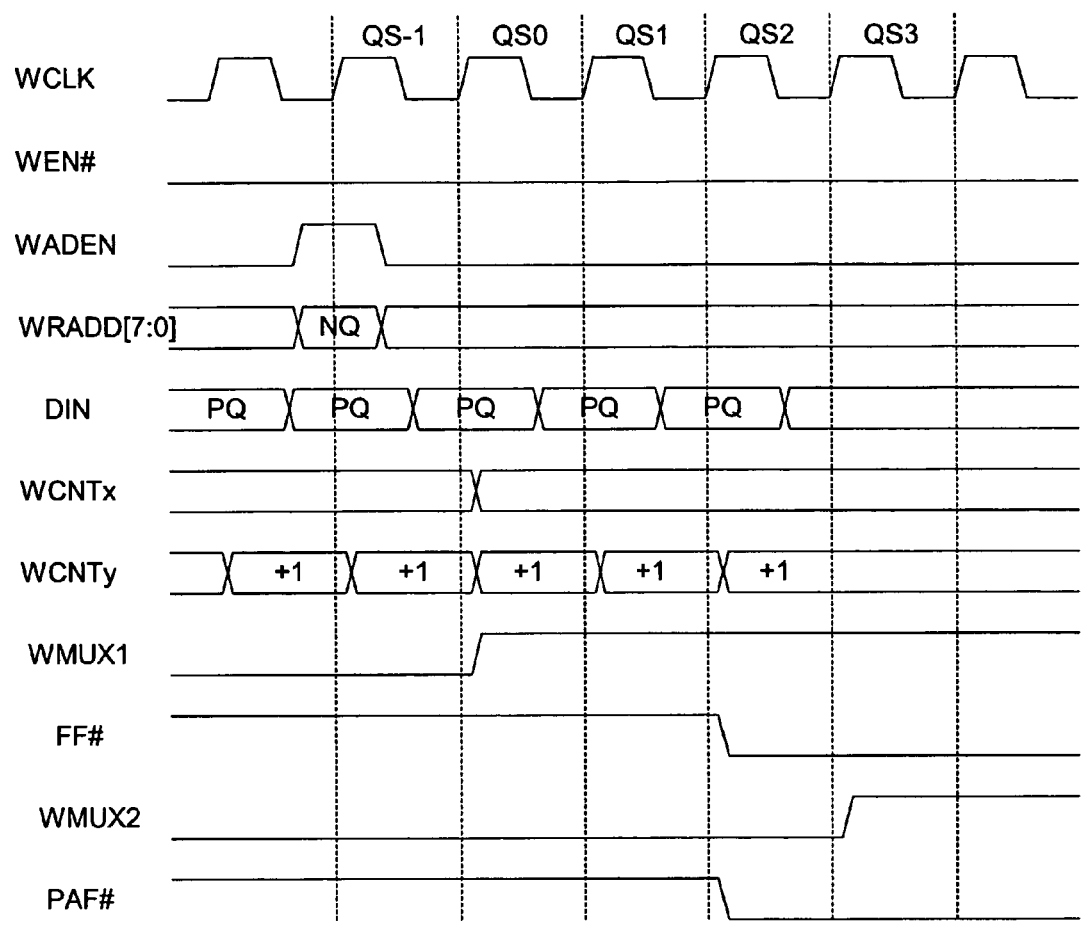

FIG. 11 is a waveform diagram illustrating the operation of write FCR system 300 in accordance with another embodiment of the present invention. The embodiment of FIG. 11 is similar to the embodiment of FIG. 9, with differences noted below. In the embodiment of FIG. 11, data values are written to the present queue PQ through write cycle QS2 in the manner described above in connection with FIG. 9. However, in the example of FIG. 11, the new queue is full during cycle QS3. Because the new queue is full, the full flag FF# and the programmable almost full flag PAF# are activated low during write cycle QS2. The logic low full flag FF# prevents data values from being written to the new queue, and prevents the write count value WCNTx from being incremented.

Figure 12:
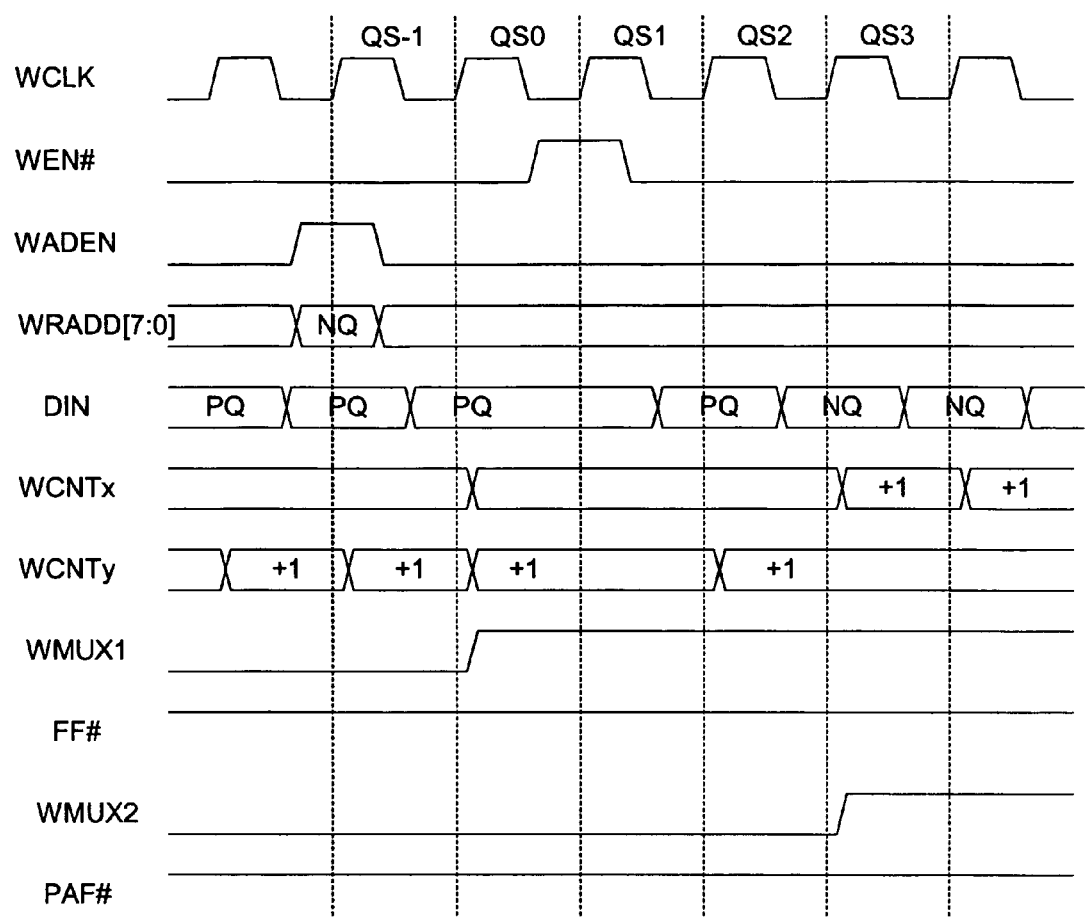

FIG. 12 is a waveform diagram illustrating the operation of write FCR system 300 in accordance with another embodiment of the present invention. The embodiment of FIG. 12 is similar to the embodiment of FIG. 9, with differences noted below. In the embodiment of FIG. 12, the write enable signal WEN# is de-activated high prior to the rising edge of write cycle QS1. The logic low write enable signal WEN# prevents a new data value from being written to the present queue during write cycle QS1, and prevents the write count value WCNTy from being incremented during write cycle QS1.

In the foregoing manner, a write queue switch can be implemented in a seamless and flexible manner, without requiring forced data fall through or pipelining the output data.

In accordance with another embodiment, a mark/re-write protocol and a mark/re-read protocol are implemented within multi-queue FIFO memory system 100. During a write (or read) queue switch, the system has the option to mark a write (or read) queue, and during the next queue switch, to request a re-write (or re-read) operation. If the queue is not marked, the system cannot request a re-write (or re-read) operation. A mark operation performed at the read port is independent of a mark operation performed at the write port. The system may mark both the write and read queues, or either one of these queues individually. In accordance with the present embodiment, the write queue is marked by controlling the write address enable signal (WADEN) and the read queue is marked by controlling the read address enable signal (RADEN). In other embodiments, the write and read queues can be marked by other signals.

The mark/re-write, mark/re-read can be used to improve the quality of written, or read data. If too many write/read errors are detected, a re-write/re-read operation can be performed, starting at the marked location.

Figure 13:
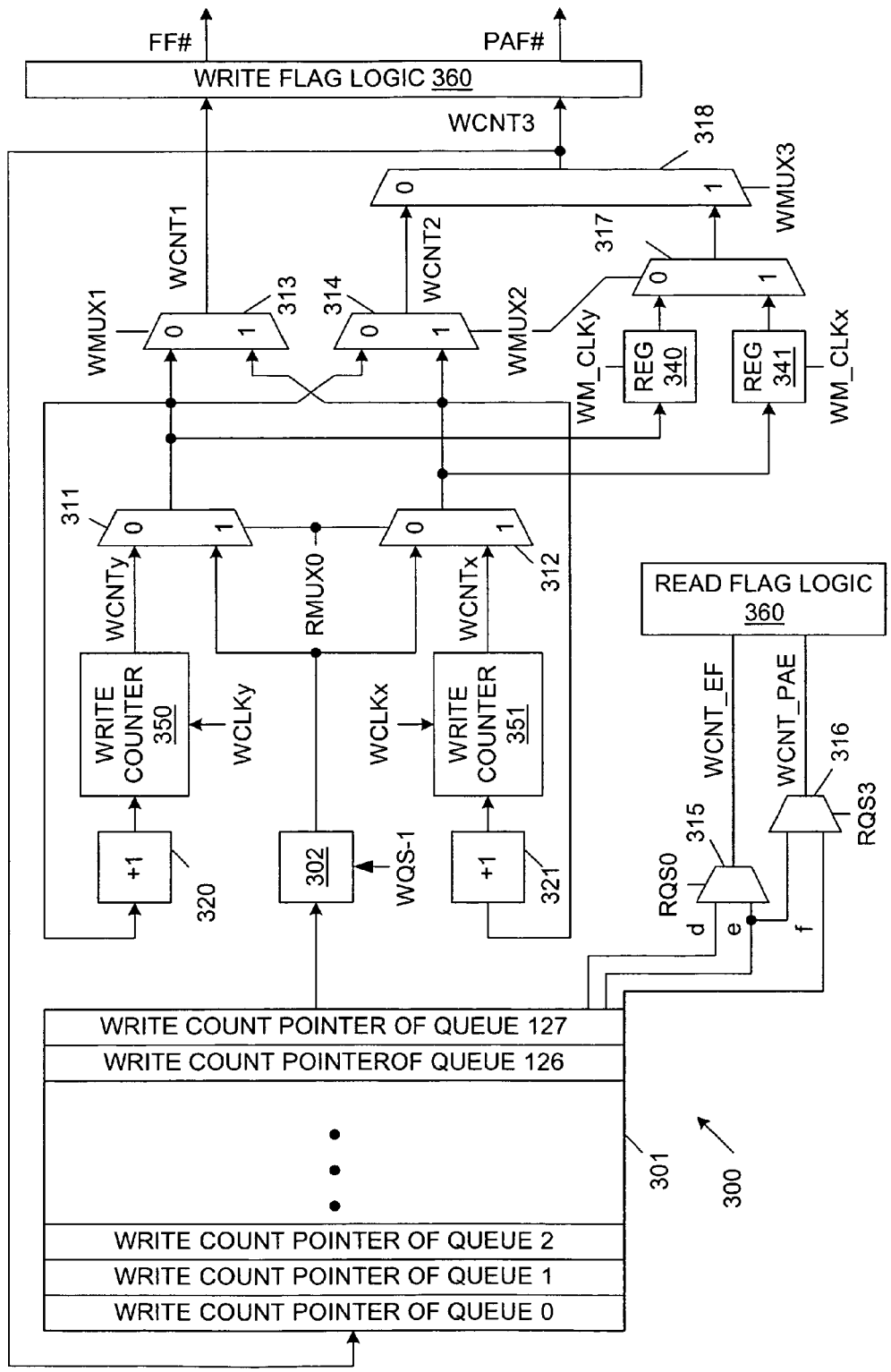
FIG. 13 is a block diagram of the write flag counter register (FCR) file of FIG. 8, which is shown in more detail to include mark/re-write circuitry.

FIG. 13 is a block diagram of the write flag counter register (FCR) system 300 of FIG. 8, which is shown in more detail to include write mark registers 340-341 and multiplexers 317-318. Write mark registers 340 and 341 are coupled to receive the write count values provided by multiplexers 311 and 312, respectively. Registers 340 and 341 are clocked in response to write mark clock signals WM_CLKy and WM_CLKx, respectively. The output terminals of write mark registers 340 and 341 are coupled to the "0" and "1" input terminals of multiplexer 317, respectively. The control terminal of multiplexer 317 is controlled by the WMUX2 signal. The output terminal of multiplexer 317 is coupled to the "1" input terminal of multiplexer 318. The "0" input terminal of multiplexer 318 is coupled to receive the write count value WCNT2 from the output of multiplexer 314. Multiplexer 318 provides a write count value WCNT3 to write flag logic 360 in response to multiplexer control signal WMUX3. Note that in the above-described operation of write FCR system 300 (FIG. 8), it is assumed that the WMUX3 signal has a logic "0" value, thereby effectively removing registers 340-341 and multiplexers 317-318 from write FCR system 300.

Figure 14:
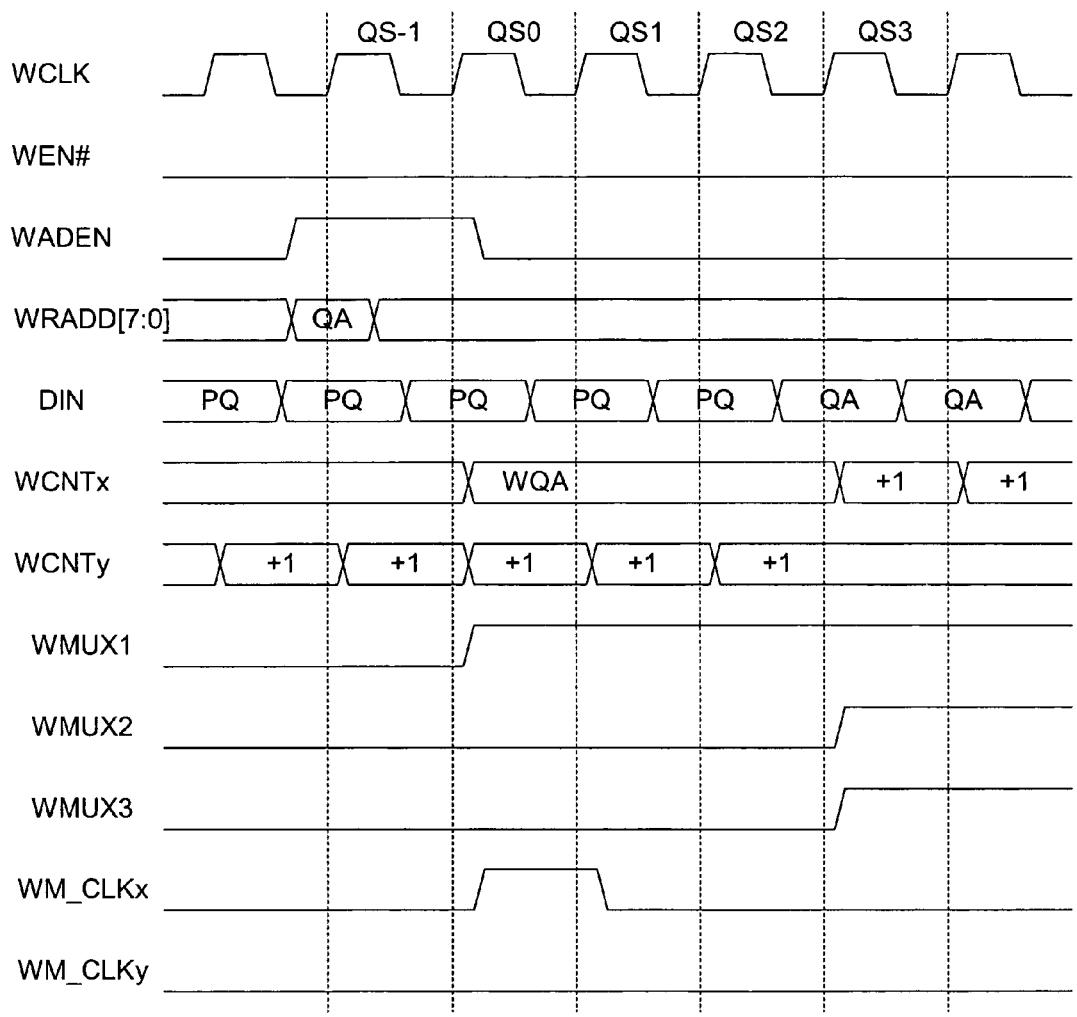
FIG. 14 is a waveform diagram illustrating a write mark operation in accordance with one embodiment of the present invention.

FIG. 14 is a waveform diagram illustrating a write mark operation in accordance with one embodiment of the present invention.

The write operations and queue switch are performed in a manner similar to that described above in connection with FIG. 9. Thus, during write cycle QS0, the write count pointer WQA associated with a new queue QA is retrieved from write FCR file 301 and stored in register 302. However, during write cycle QS0, the write address enable signal WADEN is activated to a logic "1" state. In response, the write mark clock signal WM_CLKx is activated, thereby causing the write count pointer WQA associated with the new queue QA (which is stored in register 302) to be latched into register 341. Saving the first write count pointer WQA associated with the new queue QA effectively "marks" this queue for a potential re-write operation. The WMUX3 signal transitions to a logic "1" state during cycle QS3 thereby providing the write count pointer WQA stored in register 341 as the write count value WCNT3 to write flag logic 360. As a result, data cannot be read out beyond the write queue pointer WQA stored in register 341.

Figure 15:
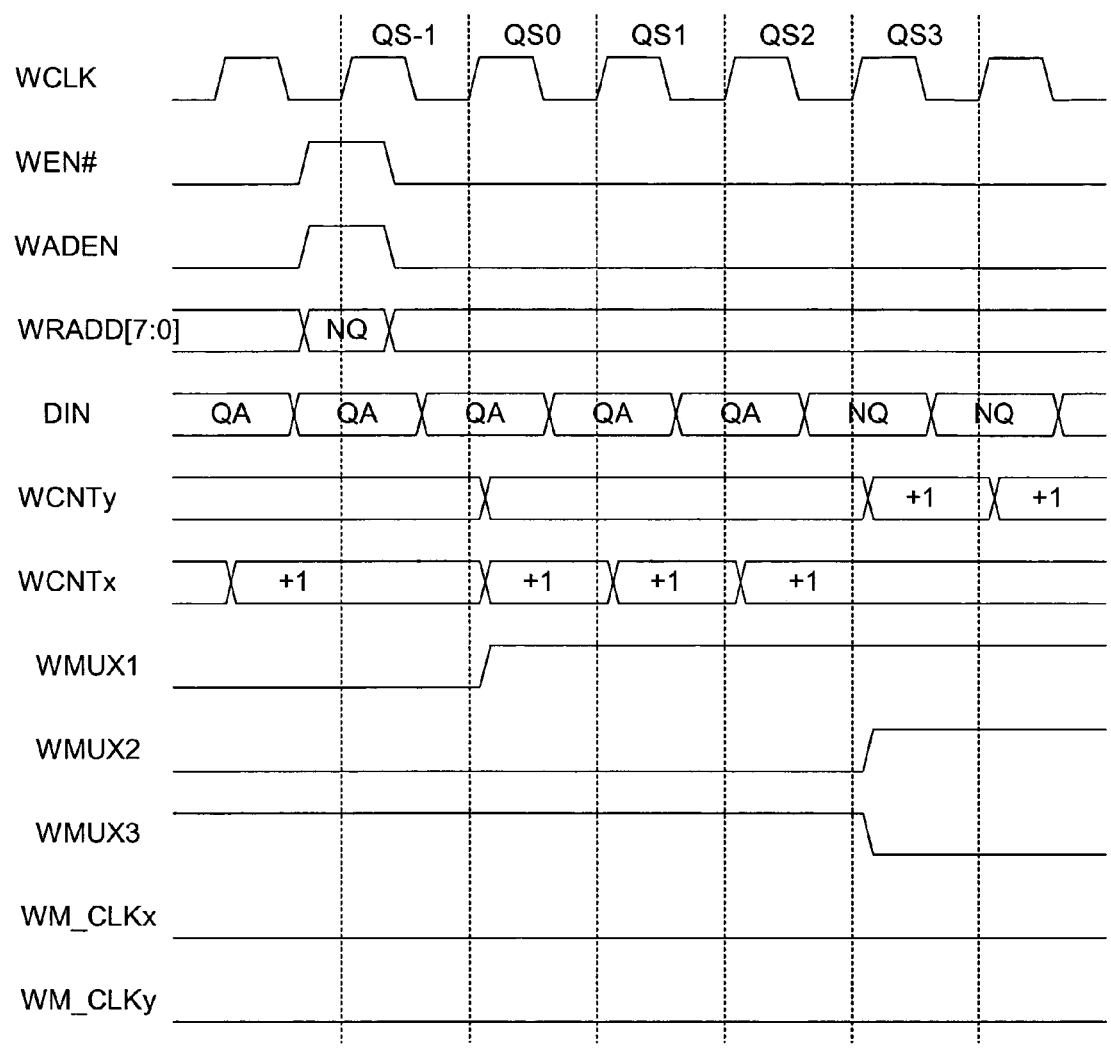
FIG. 15 is a waveform diagram illustrating the next queue switch, which occurs after the queue switch illustrated by FIG. 14.

FIG. 15 is a waveform diagram illustrating the next queue switch, which occurs after the queue switch illustrated by FIG. 14.

As illustrated in FIG. 15, the WEN# signal and the write address enable signal WADEN are both activated to logic "1" states during cycle QS-1, thereby indicating that a re-write operation should be performed to queue QA. The WMUX3 signal maintains a logic "1" value in response to the logic "1" states of the WEN# and WADEN signals. Consequently, the initial write count pointer WQA stored in register 341 continues to be routed as the WCNT3 value, and is written back to write FCR file 301 during write cycle QS2. Thus, write queue pointer associated with queue QA is not "updated" during cycles QS0-QS2.

Similarly, the original physical write address associated with the write queue QA is not updated if the write queue QA has been marked and a re-write operation has been requested. Note that the original physical write address is stored in a write memory address register (MAR) file, which is described in U.S. patent application Ser. No. 11/040,895, now U.S. Pat. No. 7,099,231 entitled, "Interleaving Memory Blocks to Relieve Timing Bottleneck in a Multi-Queue First-In First-Out Memory System" by Mario Au, Jason Z. Mo, Ta-Chung Ma and Lan Lin.

The original physical write address is always stored in the write MAR file while the write queue QA is marked.

During the next queue switch, if a re-write operation is indicated, the original physical write address stored in the write MAR file will not be overwritten by an incremented write address value. Instead, the incremented write address value is discarded in response to the re-write request. Thus, the write MAR file maintains the original physical write address during the next queue switch.

The next time that a queue switch results in queue QA being accessed, the original write queue pointer WQA and the original physical write address are retrieved, and data is written starting at the original physical write address associated with the original write queue pointer WQA. As a result, a re-write operation is performed, thereby effectively flushing the previously written data.

Figure 16:
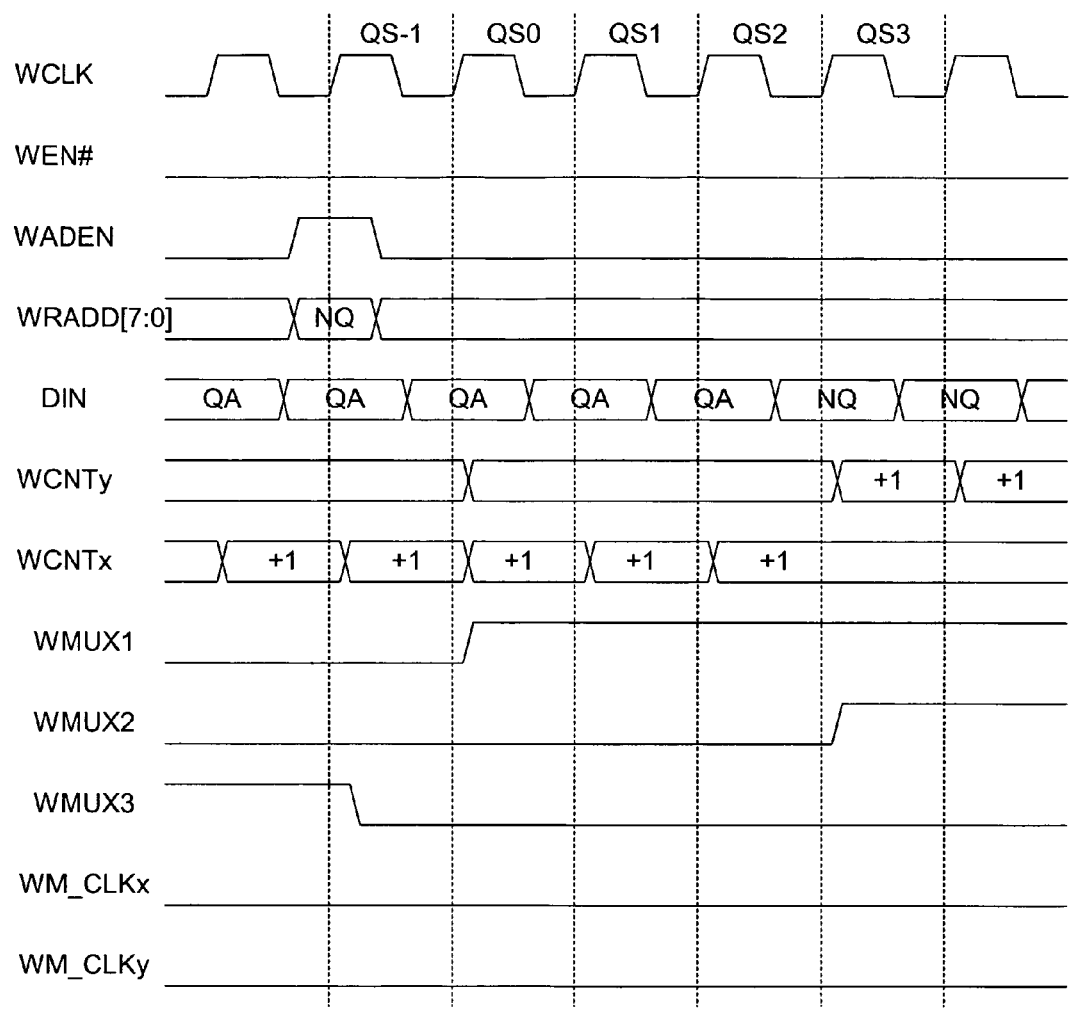
FIG. 16 is a waveform diagram illustrating operation when a queue is marked, but a re-write operation is not performed.

FIG. 16 is a waveform diagram illustrating operation when the queue QA is marked, but a re-write operation is not performed.

As illustrated in FIG. 16, the WEN# signal has a logic "0" state when the write address enable signal WADEN is activated to a logic "1" state during cycle QS-1, thereby indicating that a re-write operation should not be performed to queue QA. The WMUX3 signal transitions to a logic "0" value in response to the logic "0" state of the WEN# signal and the logic "1" state of the WADEN signal. Consequently, the updated write count pointer provided by write counter 351 is routed as the WCNT3 value, and is written back to write FCR file 301 during write cycle QS2. Thus, the write queue pointer associated with queue QA is "updated" during cycles QS0-QS2. In addition, an updated (incremented) physical write address is written back to the write MAR file, overwriting the original physical write address associated with write queue QA.

The next time that a queue switch results in queue QA being accessed, the updated write queue pointer and updated physical write address are retrieved, such that data is written starting at the updated physical write address associated with the updated write queue pointer. As a result, no re-write operation is performed, thereby keeping the previously written data.

If the present queue has not been marked for a re-write operation, then a logic high WEN# signal and a logic high WADEN signal cannot signify a re-write operation. If this situation occurs, it is regarded as a no-write condition in cycle QS-1.

Figure 17:
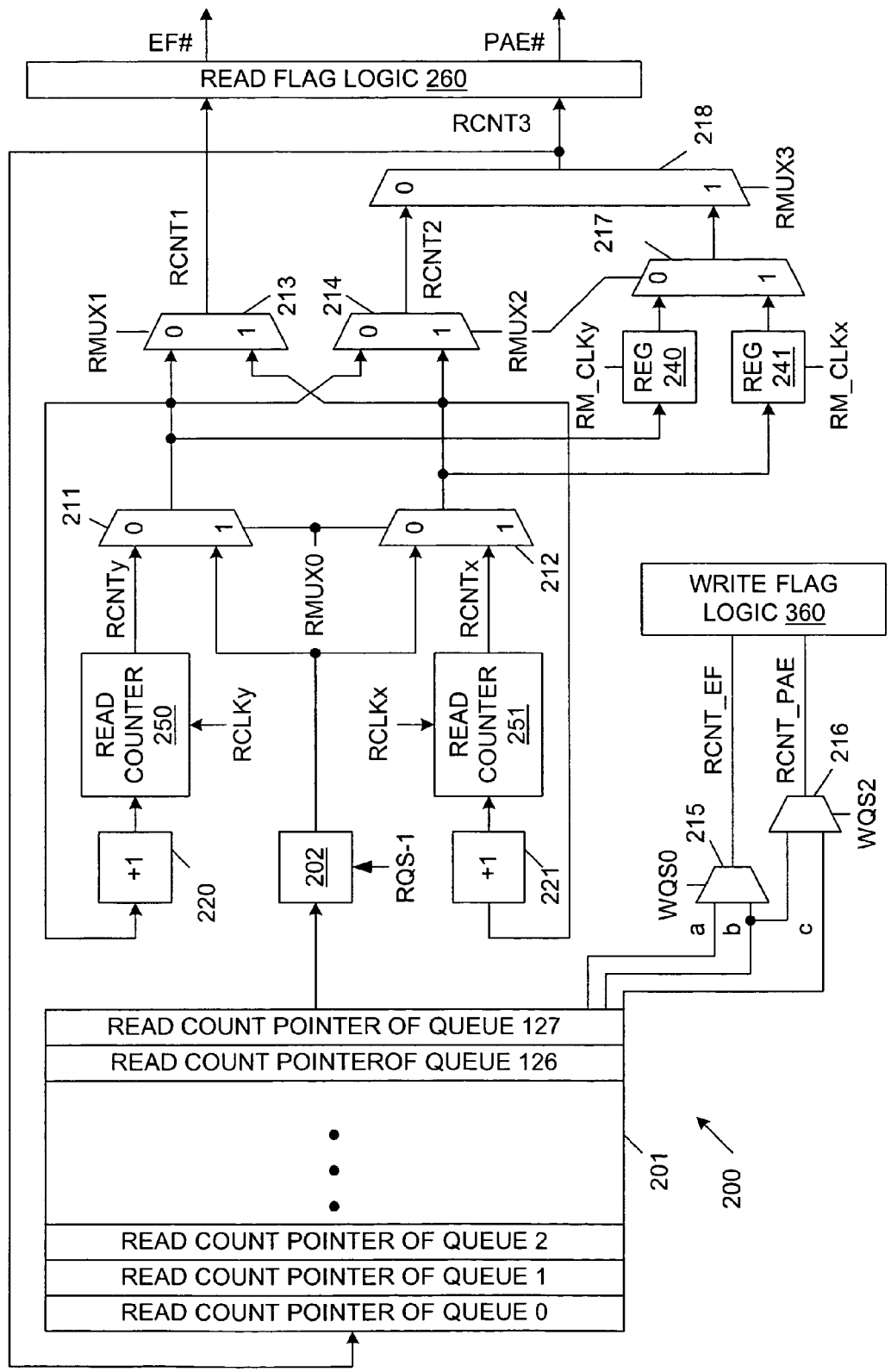
FIG. 17 is a block diagram of the read flag counter register (FCR) file of FIG. 3, which is shown in more detail to include mark/re-read circuitry.

FIG. 17 is a block diagram of the read flag counter register (FCR) system 200 of FIG. 3, which is shown in more detail to include read mark registers 240-241 and multiplexers 217-218. Read mark registers 240 and 241 are coupled to receive the read count values provided by multiplexers 211 and 212, respectively. Registers 240 and 241 are clocked in response to read mark clock signals RM_CLKy and RM_CLKx, respectively. Read mark registers 240-241 and multiplexers 217-218 are connected in the same manner as write mark registers 340-341 and multiplexers 317-318 (FIG. 13). Note that in the above-described operation of read FCR system 200 (FIG. 3), it is assumed that the RMUX3 signal has a logic "0" value, thereby effectively removing registers 240-241 and multiplexers 217-218 from read FCR system 200.

Figure 18:
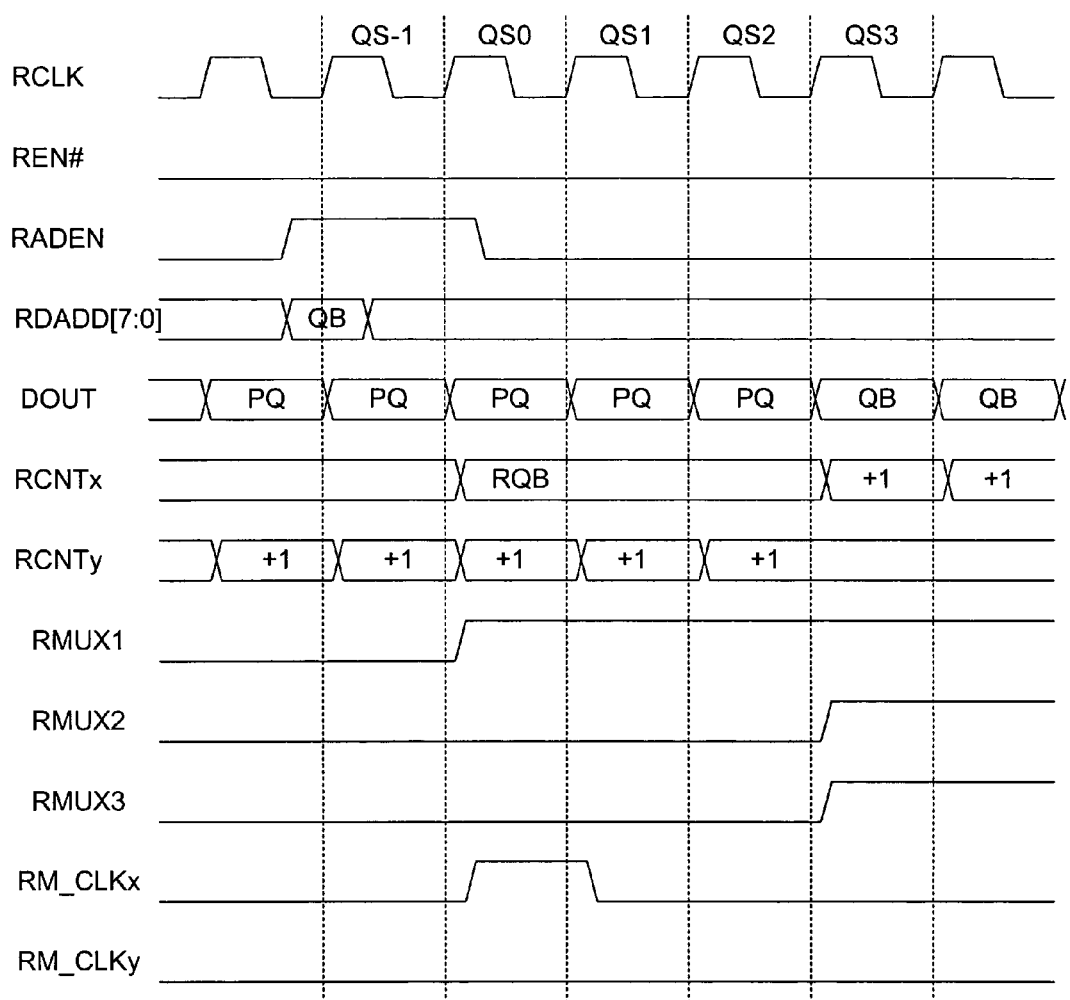
FIG. 18 is a waveform diagram illustrating a read mark operation in accordance with one embodiment of the present invention.

FIG. 18 is a waveform diagram illustrating a read mark operation in accordance with one embodiment of the present invention.

The read operations and queue switch are performed in a manner similar to that described above in connection with FIG. 4. Thus, during read cycle QS0, the read count pointer RQB associated with a new queue QB is retrieved from read FCR file 201 and stored in register 202. However, during read cycle QS0, the read address enable signal RADEN is activated to a logic "1" state. In response, the read mark clock signal RM_CLKx is activated to a logic "1" state, thereby causing the read count pointer RQB associated with the new queue QB (which is stored in register 202) to be latched into read mark register 241. Saving the first read count pointer RQB associated with the new queue QB effectively "marks" this queue for a potential re-read operation. The RMUX3 signal transitions to a logic "1" state during cycle QS3 thereby providing the read count pointer RQB stored in register 241 as the read count value RCNT3 to read flag logic 260. As a result, data cannot be written beyond the read queue pointer RQB stored in register 241.

Figure 19:
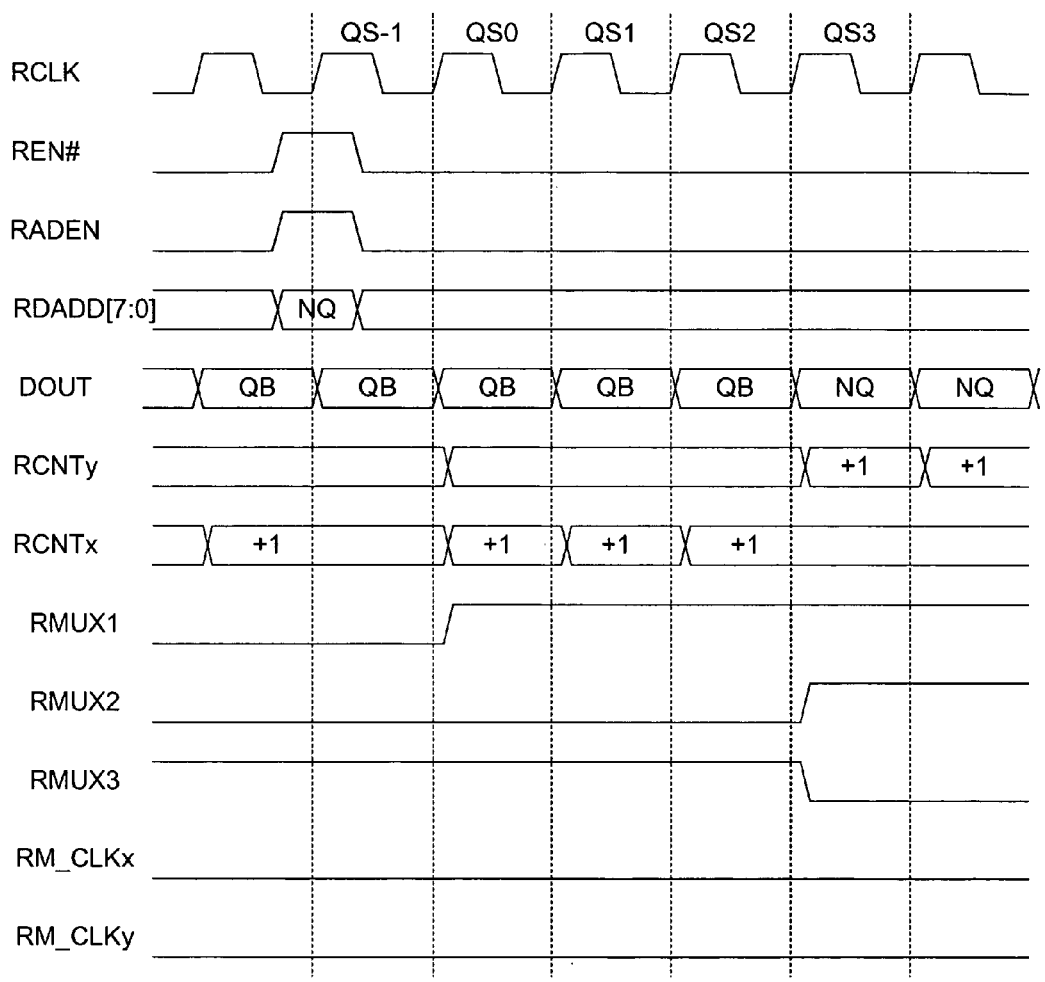
FIG. 19 is a waveform diagram illustrating the next queue switch, which occurs after the queue switch illustrated by FIG. 18.

FIG. 19 is a waveform diagram illustrating the next queue switch, which occurs after the queue switch illustrated by FIG. 18.

As illustrated in FIG. 19, the REN# signal and the read address enable signal RADEN are both activated to logic "1" states during cycle QS-1, thereby indicating that a re-read operation should be performed to queue QB. The RMUX3 signal maintains a logic "1" value in response to the logic "1" states of the REN# and RADEN signals. Consequently, the initial read count pointer RQB stored in register 241 continues to be routed as the RCNT3 value, and is written back to read FCR file 201 during read cycle QS2. Thus, the read queue pointer associated with queue QB is not "updated" during cycles QS0-QS2.

Similarly, the original physical read address associated with the read queue QB is not updated if the read queue QB has been marked and a reread operation has been requested. Note that the original physical read address is stored in a read memory address register (MAR) file, which is described in U.S. patent application Ser. No. 11/040,895, now U.S. Pat. No. 7,099,231 entitled, "Interleaving Memory Blocks to Relieve Timing Bottleneck in a Multi-Queue First-In First-Out Memory System" by Mario Au, Jason Z. Mo, Ta-Chung Ma and Lan Lin. The original physical read address is always stared in the read MAR file while the read queue QB is marked. During the next queue switch, if a re-read operation is indicated, the original physical read address stored in the read MAR file will not be overwritten by an incremented read address value. Instead, the incremented read address value is discarded in response to the re-read request. Thus, the read MAR file maintains the original physical read address during the next queue switch.

The next time that a queue switch results in queue QB being accessed, the original read queue pointer RQB and the original physical read address are retrieved, such that data is read starting at the original physical read address associated with the original read queue pointer RQB. As a result, a re-read operation is performed.

Figure 20:
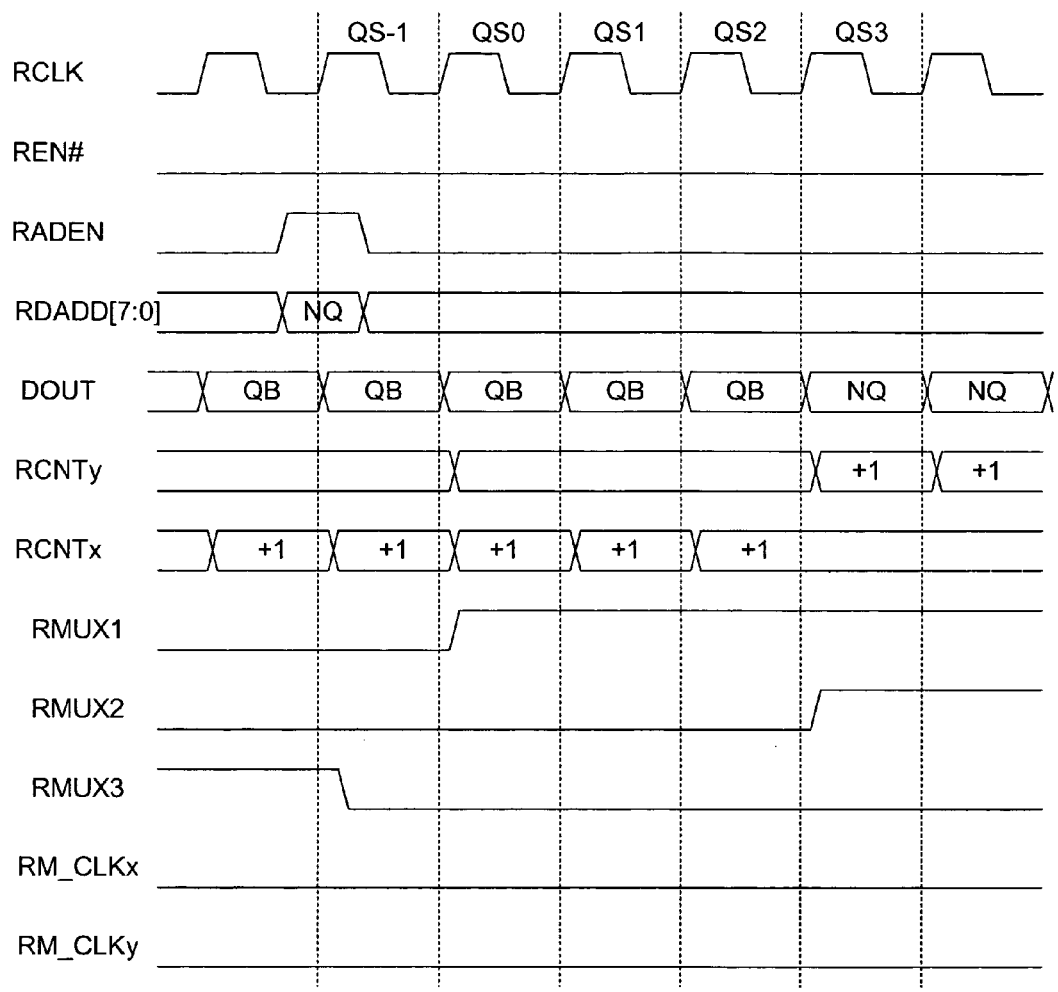
FIG. 20 is a waveform diagram illustrating operation when the queue QB is marked, but a re-read operation is not performed.

FIG. 20 is a waveform diagram illustrating operation when the queue QB is marked, but a re-read operation is not performed.

As illustrated in FIG. 20, the REN# signal has a logic "0" state when the read address enable signal RADEN is activated to logic "1" states during cycle QS-1, thereby indicating that a re-read operation should not be performed to queue QB. The RMUX3 signal transitions to a logic "0" value in response to the logic "0" state of the REN# signal and the logic "1" state of the RADEN signal. Consequently, the updated read count pointer provided by read counter 251 is routed as the RCNT3 value, and is written back to read FCR file 201 during write cycle QS2. Thus, the read queue pointer associated with queue QB is "updated" during cycles QS0-QS2. In addition, an updated (incremented) physical read address is written back to the read MAR file, overwriting the original physical read address associated with read queue QB.

The next time that a queue switch results in queue QB being accessed, the updated read queue pointer and updated physical read address are retrieved, and data is read starting at the updated physical read address associated with the updated read queue pointer. As a result, no re-read operation is performed.

If the present queue has not been marked for a re-read operation, then a logic high REN# signal and a logic high RADEN signal cannot signify a re-read operation. If this situation occurs, it is regarded as a no-read condition in cycle QS-1.

A same queue switch operation can be implemented in connection with the mark/re-write and mark/re-read operations. A same queue switch operation is defined as an operation wherein processing is "switched" from a queue to the same queue. The conditions of the same queue switch during a read operation are described below. Conditions are similar for a same queue switch during a write operation.

If the present queue is marked, a re-read operation is specified if the REN# signal is high during cycle QS-1, and data from the last updated read location will be output in cycle QS3. If the new queue is not marked (i.e., RADEN is low during cycle QS0), the marker is removed after cycle QS3 (i.e., the RMUX3 signal transitions to a logic "0" state). However, if the new queue is marked (i.e., RADEN is high during cycle QS0), then a mark is kept after cycle QS3 (i.e., the RMUX3 signal transitions to a logic "1" state). The condition where REN# is low during cycle QS-1 during a same queue switch (i.e., no re-read) is not allowed when the present queue is marked.

If the present queue is not marked and a same queue switch is initiated, the queue switch is ignored by the read logic 121.

However, if the RADEN signal has a logic "1" state during cycle QS0, a mark is added to the present queue during cycle QS3.

Although the invention has been described in connection with several embodiments, it is understood that this invention is not limited to the embodiments disclosed, but is capable of various modifications, which would be apparent to one of ordinary skill in the art. Thus, the present invention is only intended to be limited by the following claims.

We claim:

1. A multi-queue memory system comprising:
   a first read counter configured to maintain a first read count pointer associated with a present queue being read;
   a first mark register coupled to the first read counter and configured to store an initial read count pointer associated with the present queue;
   a second read counter configured to maintain a second read count pointer associated with a next queue to be read;
   a second mark register coupled to the second read counter and configured to store a second initial read count pointer associated with the next queue; and
   a read queue register file configured to store read count pointers associated with queues of the multi-queue memory system, the read queue register file being coupled to the first and second read counters.

2. The multi-queue memory system of claim 1 further comprising a selection circuit configured to route the first read count pointer or the initial read count pointer associated with the present queue to the read queue register file.

3. The multi-queue device of claim 1, further comprising means for writing the first read count pointer or the initial read count pointer associated with the present queue to the read queue register file when the present queue is not longer being read.

4. The multi-queue memory system of claim 1, further comprising:
   selection circuit coupled to receive the first read count pointer, the second read count pointer, the initial read count pointer associated with the present queue and the second initial read count pointer associated with the next queue; and
   read flag logic for generating an empty flag coupled to the selection circuit.

5. The multi-queue device of claim 1, further comprising:
   means for incrementing the first read counter each time the present queue is read; and
   means for incrementing the second read counter each time the next queue is read.

6. A multi-queue memory system comprising:
   a first write counter configured to maintain a first write count pointer associated with a present queue being written;
   a first mark register coupled to the first write counter and configured to store an initial write count pointer associated with the present queue;
   a second write counter configured to maintain a second write count pointer associated with a next queue to be written;
   a second mark register coupled to the second write counter and configured to store a second initial write count pointer associated with the next queue; and
   a write queue register file configured to store write count pointers associated with queues of the multi-queue memory system, the write queue register file being coupled to the first and second write counters.

7. The multi-queue memory system of claim 6, further comprising a selection circuit configured to route the first write count pointer or the initial write count pointer associated with the present queue to the write queue register file.

8. The multi-queue device of claim 6, further comprising means for writing the first write count pointer or the initial write count pointer associated with the present queue to the write queue register file when the present queue is not longer being written.

9. The multi-queue memory system of claim 6, further comprising:
   a selection circuit coupled to receive the first write count pointer, the second write count pointer,
   the initial write count pointer associated with the present queue and the second initial write count pointer associated with the next queue; and
   write flag logic for generating a full flag coupled to the selection circuit.

10. The multi-queue device of claim 6, further comprising:
    means for incrementing the first write counter each time the present queue is written; and
    means for incrementing the second write counter each time the next queue is written.

11. A method of operating a multi-queue memory system, comprising;
    storing a plurality of read count pointers in a read address file, wherein each of the read count pointers is associated with a corresponding queue of the multi-queue device;
    retrieving a first read count pointer associated with a first queue from the read address file;
    storing the retrieved first read count pointer in a first read mark register to make the first queue available for a re-read operation;
    performing one or more read accesses to the first queue, wherein a first read counter adjusts the first read count pointer for each read access to the first queue, thereby creating an adjusted first read count pointer;
    transferring the first read count pointer from the first read mark register to the read address file to enable a re-read operation from the first queue;
    transferring the adjusted first read count pointer from the first read counter to the read address file to disable a re-read operation from the first queue;
    retrieving a second read count pointer associated with a second queue from the read address file;
    storing the retrieved second read count pointer in a second read mark register to make the second queue available for a re-read operation;
    performing one or more read accesses to the second queue, wherein a second read counter adjusts the second read count pointer for each read access to the second queue, thereby creating an adjusted second read count pointer;
    transferring the second read count pointer from the second read mark register to the read address file to enable a re-read operation from the second queue; and
    transferring the adjusted second read count pointer from the second read counter to the read address file to disable a re-read operation from the second queue.

12. The method of claim 11, further comprising generating an empty flag in response to
    the first read count pointer stored in the first read mark register during read accesses of the first queue if the first queue is available for a re-read operation.

13. The method of claim 12, further comprising generating an empty flag in response to the adjusted first read count pointer during read accesses to the first queue if the first queue is not available for a re-read operation.

14. A method of operating a multi-queue memory system, comprising:

storing a plurality of write count pointers in a write address file, wherein each of the write count pointers is associated with a corresponding queue of the multi-queue device;

retrieving a first write count pointer associated with a first queue from the write address file;

storing the retrieved first write count pointer in a first write mark register to make the first queue available for a re-write operation;

performing one or more write accesses to the first queue, wherein a first write counter adjusts the first write count pointer for each write access to the first queue, thereby creating an adjusted first write count pointer;

transferring the first write count pointer from the first write mark register to the write address file to enable a re-write operation to the first queue;

transferring the adjusted first write count pointer from the first write counter to the write address file to disable a re-write operation to the first queue;

retrieving a second write count pointer associated with a second queue from the write address file;

storing the retrieved second write count pointer in a second write mark register to make the second queue available for a re-write operation;

performing one or more write accesses to the second queue, wherein a second write counter adjusts the second write count pointer for each write access to the second queue, thereby creating an adjusted second write count pointer;

transferring the second write count pointer from the second write mark register to the write address file to enable a re-write operation to the second queue; and transferring the adjusted second write count pointer from the second write counter to the write address file to disable a re-write operation to the second queue.

15. The method of claim 14, further comprising generating a full flag in response to the first write count pointer stored in the first write mark register during write accesses of the first queue if the first queue is available for a re-write operation.

16. The method of claim 15, further comprising generating a full flag in response to the adjusted first write count pointer during write accesses to the first queue if the first queue is not available for a re-write operation.

* * * * *